United States Patent
Zhang et al.

(10) Patent No.: US 11,635,546 B2
(45) Date of Patent: Apr. 25, 2023

(54) OPTICALLY TRANSMISSIVE DEVICES AND FABRICATION

(71) Applicants: University of Massachusetts, Boston, MA (US); Massachusetts Institute of Technology, Cambridge, MA (US)

(72) Inventors: Hualiang Zhang, Arlington, MA (US); Jun Ding, Lowell, MA (US); Juejun Hu, Newton, MA (US); Tian Gu, Fairfax, VA (US); Hanyu Zheng, Cambridge, MA (US)

(73) Assignees: University of Massachusetts, Boston, MA (US); Massachusetts Institute of Technoloqy, Cambridge, MA (US)

( * ) Notice: Subject to any disclaimer, the term of this patent is extended or adjusted under 35 U.S.C. 154(b) by 509 days.

(21) Appl. No.: 16/624,054

(22) PCT Filed: Jun. 28, 2018

(86) PCT No.: PCT/US2018/039925
§ 371 (c)(1),
(2) Date: Dec. 18, 2019

(87) PCT Pub. No.: WO2019/006076
PCT Pub. Date: Jan. 3, 2019

(65) Prior Publication Data
US 2020/0150311 A1    May 14, 2020

Related U.S. Application Data

(60) Provisional application No. 62/527,189, filed on Jun. 30, 2017.

(51) Int. Cl.
*G02B 1/00*    (2006.01)
*C23C 14/04*    (2006.01)
(Continued)

(52) U.S. Cl.
CPC ........... *G02B 1/002* (2013.01); *C23C 14/042* (2013.01); *C23C 14/048* (2013.01);
(Continued)

(58) Field of Classification Search
CPC ..... G02B 1/002; G02B 5/204; H01J 37/3178; C23C 14/042; C23C 14/048; C23C 14/0623
See application file for complete search history.

(56) References Cited

U.S. PATENT DOCUMENTS 5,760,871 A * 6/1998 Kosoburd ............. A61F 2/1613
                                                         359/569
9,651,718 B2 * 5/2017 Chen ..................... G02B 5/1876
10,725,290 B2 * 7/2020 Fan ..................... G02B 27/0012
(Continued)

FOREIGN PATENT DOCUMENTS

CN         1677525 A   * 10/2005   ......... G11B 7/24038

OTHER PUBLICATIONS

Ding Jun et al, "Mid-IR high-index dielectric Huygens metasurfaces", Proceedings of SPIE, SPIE, 1000 20th St. Bellingham WA 98225-6705 USA,vol. 9742, Mar. 4, 2016 (Mar. 4, 2016), p. 97421I-97421I.

(Continued)

*Primary Examiner* — Joseph P Martinez
*Assistant Examiner* — Vipin Patel
(74) *Attorney, Agent, or Firm* — Armis IP Law, LLC

(57) ABSTRACT

An optical device as described herein includes a host substrate fabricated from a dielectric material transparent in the Infrared range. Additionally, the optical device as discussed herein includes multiple elements disposed on the host substrate. The multiple elements are spaced apart from each other on the host substrate in accordance with a desired pattern. Each of the multiple elements disposed in the host substrate is fabricated from a second material having a
(Continued)

refractive index of greater than 4.5. Such an optical device provides an improvement over conventional optical devices that operate in the Infrared range.

43 Claims, 29 Drawing Sheets

(51) Int. Cl.
  *C23C 14/06* (2006.01)
  *G02B 5/20* (2006.01)
  *H01J 37/317* (2006.01)
(52) U.S. Cl.
  CPC .......... *C23C 14/0623* (2013.01); *G02B 5/204* (2013.01); *H01J 37/3178* (2013.01)

(56) References Cited

U.S. PATENT DOCUMENTS

| | | | |
|---|---|---|---|
| 2003/0133458 A1* | 7/2003 | Sato | H04L 12/1854 370/395.6 |
| 2014/0139912 A1* | 5/2014 | Osawa | G02B 5/285 359/359 |
| 2016/0025914 A1* | 1/2016 | Brongersma | G02B 5/001 359/489.07 |
| 2017/0052114 A1* | 2/2017 | Lin | G01N 21/554 |
| 2017/0097451 A1* | 4/2017 | Kyoung | G02B 5/286 |

OTHER PUBLICATIONS

Fei Ding et al, "Gradient metasurfaces: fundamentals and applications", arxiv.org, Cornell University Library, 201 Olin Library Cornell University Ithaca, NY 14853,Apr. 10, 2017 (Apr. 10, 2017).

Hsiao et al., "Fundamentals and Applications of Metasurfaces", Small Methods,vol. 1, Apr. 10, 2017 (Apr. 10, 2017), p. 1-20.

Wang et al., "Switchable Ultrathin Quarter-wave Plate in Terahertz Using Active Phas.chnage Metasurface", Scientific Reports,vol. 5, Oct. 7, 2015 (Oct. 7, 2015), p. 1-9.

International Search Report, PCT/US2018/039925, dated Oct. 24, 2018, pp. 4.

* cited by examiner

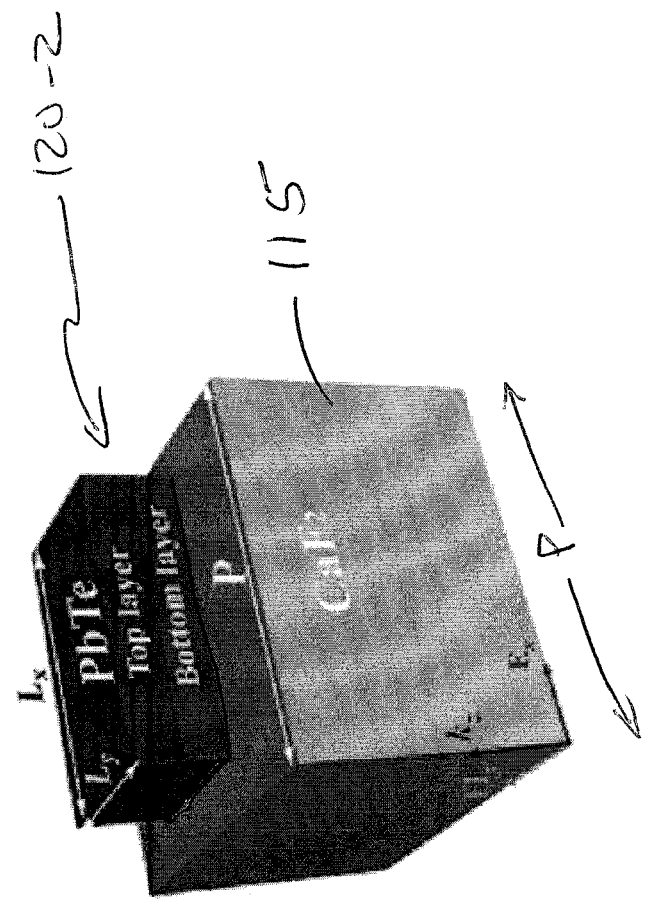
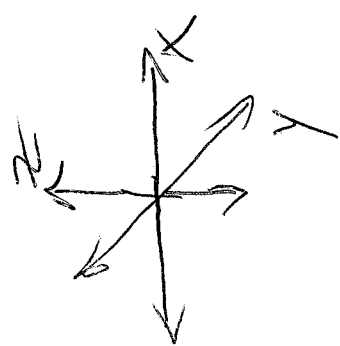
FIG. 15

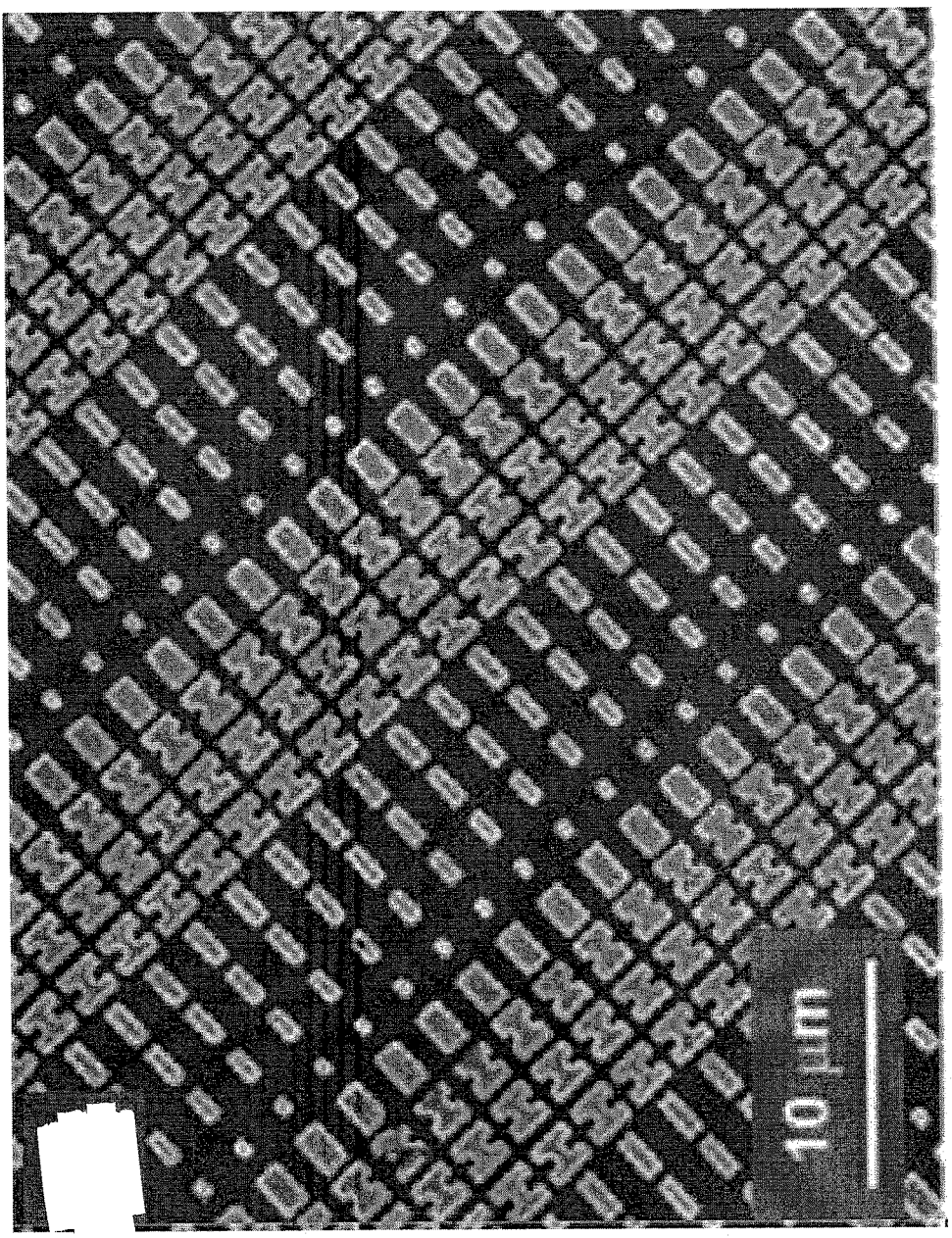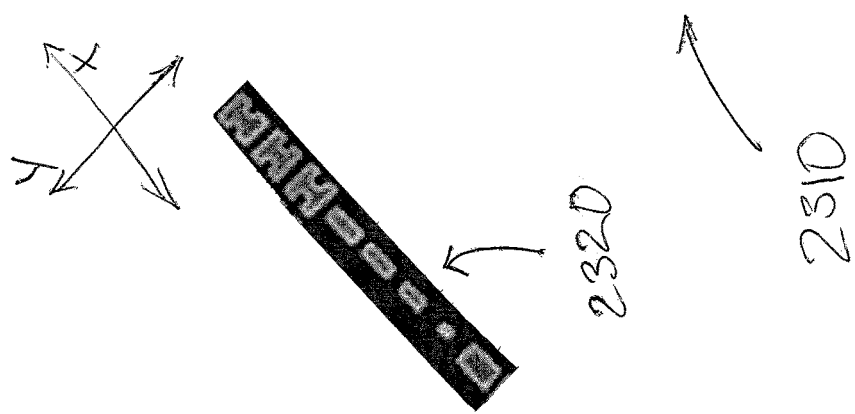
FIG. 23

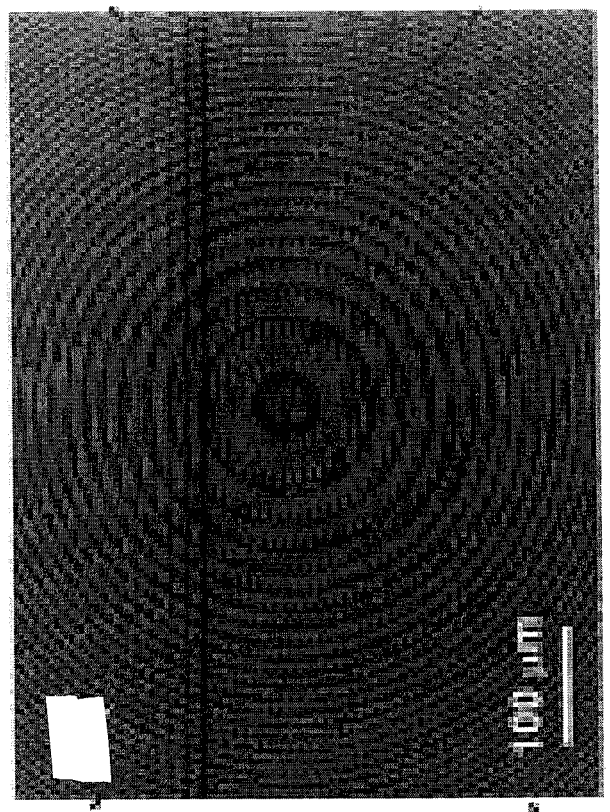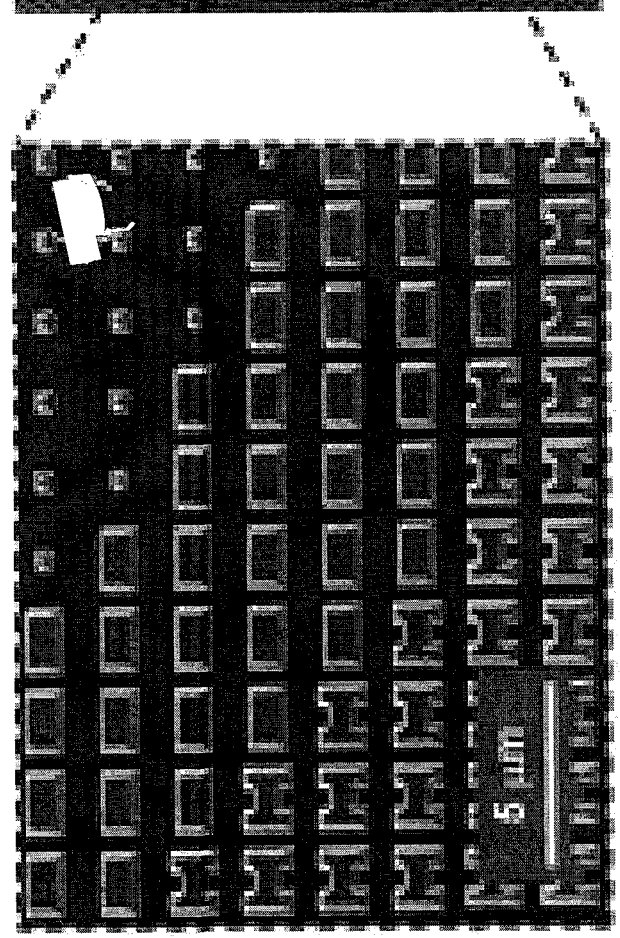
FIG. 27

OPTICALLY TRANSMISSIVE DEVICES AND FABRICATION

RELATED APPLICATIONS

This application is a national stage filing of PCT application No.: PCT/US2018/039925 filed Jun. 28, 2018 entitled OPTICALLY TRANSMISSIVE DEVICES AND FABRICATION, which claims priority to U.S. Provisional Patent Application No. 62/527,189 filed Jun. 30, 2017 entitled ULTRA-THIN, HIGH-EFFICIENCY MID-INFRARED TRANSMISSIVE HUYGENS META-OPTICS.

GOVERNMENT RIGHTS

This invention was made with Government support under Award No. HR00111720029 awarded by DARPA (Defense Advanced Research Projects Agency). The government may have certain rights in the invention.

BACKGROUND

A conventional electromagnetic metasurface refers to a type of artificial sheet material having a sub-wavelength thickness. Metasurfaces can be either structured or unstructured with subwavelength-scaled patterns in the horizontal dimensions.

In one conventional application, metasurfaces are slabs of subwavelength thickness containing subwavelength in-plane features (so-called meta-atoms) that are used to realize a desirable functionality by local modification of the interaction between the slab and incident electromagnetic fields. Due to the subwavelength thickness, this interaction can be well modeled by equivalent surface boundary conditions, dictated by the metasurface implementation.

The mid IR (Infrared) band of electromagnetic radiation is a particular useful part of the spectrum. It can provide imaging in the dark, tracing of heat signatures, sensitive detection of many biomolecular and chemical signals, etc.

BRIEF DESCRIPTION OF EMBODIMENTS

Unfortunately, conventional bulk optical devices supporting IR frequencies are difficult to fabricate. Accordingly, conventional optical device supporting IR frequencies are highly specialized and expensive.

In contrast to conventional optical devices, the optical devices as discussed herein include novel device geometries to redirect optical signals (such as IR light) in any suitable manner Such optical devices are useful over conventional devices because they are low-weight, low-cost, and easily integrated/fabricated on a respective substrate.

First Embodiments

More specifically, in one example embodiment, an optical device as described herein includes a host substrate fabricated from a first material. In one embodiment, the first material is a dielectric material transparent in the Infrared range (such as mid-IR range). Additionally, the optical device as discussed herein includes multiple elements disposed on the host substrate. In one embodiment, multiple elements are spaced apart from each other on the host substrate in accordance with a pattern. Each of the multiple elements disposed in the host substrate is fabricated from a second material having a refractive index of greater than 4.5. Such an optical device is useful because it is easy to fabricate, yet it provides a low cost alternative to conventional optical devices that are non-planar, bulky, and large in profile, etc.

Note that a combination of the host substrate and the multiple elements are operable to redirect incident optical signals in a desired manner In one embodiment, the combination of the host substrate and the multiple elements are operable to redirect incident optical signals of wavelengths in an Infrared range such as mid IR range (wavelengths between 3,000 to 8,000 nanometers).

In accordance with further embodiments, a thickness of the multiple elements is less than or equal to one eighth of the free space wavelength to which the optical device is tuned to redirect inputted optical signals.

In yet further embodiments, a combination of the host substrate and the multiple elements modulates the phase of the incident light.

In accordance with still further embodiments, a combination of the host substrate and the multiple elements modulates the amplitude of the incident light.

In one embodiment, a combination of the host substrate and the multiple elements modulates the polarization of the incident light.

In accordance with further embodiments, the first material has a refractive index of less than 1.5, although the first material may have a refractive index greater than 1.5 in certain instances.

Both the first material and second material of the optical device can be any suitable material. In one non-limiting example embodiment, the first material (used to fabricate the host substrate) of the optical device is a Flouride-based material; the second material (used to fabricate the multiple elements) is a chalcogenide-based material.

In accordance with further embodiments, the first material of the optical device used to fabricate the host substrate includes Calcium Flouride (CaF2) to achieve a refractive index of less than 1.5. The second material of the optical device used to fabricate the multiple elements (on the host substrate) includes Lead Telluride (PbTe) to achieve a refractive index of greater than 4.5.

Note that the multiple elements disposed on the host substrate can be any suitable shape and size. For example, in one embodiment, the multiple elements fabricated from the second material include a first set of elements of a first type of structure (such as a rectangular shaped structure as discussed herein) and a second set of elements of a second type structure (such as an H-shaped structure as discussed herein). A third type of structure (such as a cross-shaped structure) can be used as a basis to fabricate one or more of the multiple elements on the host substrate. The multiple elements disposed on the host substrate, therefore, can include combination of one or more different types of structures as discussed herein (such as rectangular structure, bar-shaped structure, H-shaped structure, cross-shaped structure, etc.). The different shapes and sizes of the elements in the first set and the second set vary depending on the embodiment.

In accordance with other embodiments, the first set of elements and the second set of elements are disposed on a same surface (such as a so-called Huygens metasurface) of the host substrate (first material) in accordance with a predefined pattern to redirect an incident optical signal passing through the combination of first material and second material.

In accordance with further embodiments, the refractive index of the host substrate and respective multiple elements can be any suitable value. In one embodiment, a difference between the refractive index of the second material (to fabricate the multiple elements) and the refractive index of the first material (to fabricate the host substrate) is greater than 3.1. The first material and the second material are at least partly optically transmissive. In one embodiment, a combination of the host substrate and the multiple elements as disposed thereon provides an optical efficiency of greater than 75% through the optical device for wavelengths in the mid infrared wavelength range.

As previously discussed, the thickness of the host substrate and the multiple elements is relatively thin. For example, in one embodiment, a thickness of the multiple (meta-surface) elements (second material) is less than 1000 nanometers. In one non-limiting example embodiment, the thickness of the host substrate is on the order of hundred microns to millimeter range. Such a small form factor is useful in many suitable optical applications. A length and width of the optical device varies depending on the embodiment.

The surface of the host substrate on which the multiple elements reside can be any suitable shape. In one embodiment, one or more of the surfaces of the host substrate are substantially planar. Alternatively, one or more surfaces of the host substrate can be curved, convex, etc.

In one embodiment, a thickness of the multiple elements is a portion of the wavelength to which the optical device is tuned to redirect inputted optical signals. For example, the thickness can be less than or equal to one eighth of a free space wavelength to which the optical device is tuned to redirect optical signals.

In accordance with yet further embodiments, the multiple elements can be disposed on opposite facings of the optical device. For example, a first facing of the optical device can include thereon a first set of elements (such as different shapes and sizes of elements) fabricated of the second material. A second facing of the optical device can include a second set of multiple elements (such as different shapes and sizes of elements) fabricated from the second material. The first set of elements can include the same or different shaped elements. The second set of elements can include the same or different shaped elements. Thus, embodiments herein include an optical device including multiple elements fabricated from a second material (or one or more other materials) in which a first portion (set) of the multiple elements is disposed on a first surface facing of the host substrate, a second portion (set) of the multiple elements is disposed on a second surface facing of the host substrate.

In accordance with further embodiments, the optical device includes a layer of material adhered to the host substrate. The layer of material includes an opening that defines an aperture in which to receive optical signals.

In accordance with still further embodiments, the multiple elements are disposed on a first surface of the host substrate; a second surface of the host substrate is curved.

Yet further embodiments herein include an optical device in which the multiple elements are disposed on one or more curved surfaces of the host substrate.

Further embodiments herein include any number of host substrate layers of substrate material on which individual elements are disposed to redirect a received optical signal. The surfaces of the layers can be curved or planar.

In one embodiment, the optical device includes a first host substrate and a second host substrate. The second host substrate is coupled to the first host substrate. The multiple elements of the optical device include a first set of elements and a second set of elements. The optical device further includes a third set of elements. The first host substrate includes a first surface and a second surface; the first set of elements are disposed on the first surface; the second set of elements are disposed on the second surface; the third set of elements are disposed on the surface of the second host substrate. In one embodiment, the second surface of the first host substrate is curved. The surface of the second host substrate is curved.

The combination of the one or more host substrates, the multiple elements, etc., modulates the phase, amplitude, and/or polarization of the incident light and thus effectively forms one or a series of optical devices, including, e.g., a lens, diffractive beam deflector, cylindrical lens, aspheric lens, beam splitter, etc.

Second Embodiments

In accordance with further embodiments, an optical device as discussed herein includes a host substrate (fabricated from a first material) and a first set of multiple elements (fabricated from a second material) disposed on a facing of the host substrate. Each of the multiple elements in the first set is spaced apart from each other. In one embodiment, each of the first set of multiple elements has an H-shaped geometry. Additionally or alternatively, each of the first set of multiple elements can be a rectangular-shaped geometry.

In one embodiment, the H-shaped shaped geometry of the multiple elements in the first set provides an optical transmittance of greater than 80% for phase shifts between zero and 120 degrees. Fabrication of a combination of the host substrate and the multiple elements provides an optical efficiency there through of greater than 75% in the designed wavelengths within mid infrared wavelength range.

In accordance with further embodiments, in addition to the first set of multiple elements, such as fabricated from the second material (having a second refractive index), the optical device includes a second set of multiple elements disposed on a facing of the host substrate. In one embodiment, each of the multiple elements in the second set of multiple elements is fabricated from the second material (having the second refractive index) and has a rectangular-shaped geometry (such as a six-sided shape).

Note that the geometry of the optical device such as shape, size, etc., of the substrate and of the multiple elements (such as first set, second set, etc.) can be selected to provide desired tuning or redirection of inputted one or more optical signals.

In accordance with further embodiments, the first set of multiple elements and the second set of multiple elements are disposed on the host substrate in accordance with a predefined pattern to provide a respective desired optical redirection.

As previously discussed, in one embodiment, the first material to fabricate the host substrate is a Flouride-based material. The second material to fabricate the multiple elements is a chalcogenide-based material.

In accordance with still further embodiments, the difference between the refractive index of the second material and the refractive index of the first material is greater than 2.5. The thickness of the multiple elements is less than or equal to one eighth of a free space wavelength to which the optical device is tuned.

Third Embodiments

Further embodiments herein include a method of fabricating an optical device as previously discussed. For example, in one embodiment, a fabricator receives a host substrate fabricated from a first material having a refractive index of less than 1.5. If desired, the fabricator can be configured to produce the host substrate. The fabricator disposes multiple elements on the host substrate. In accordance with a design specification indicating attributes of the host substrate and the multiple elements thereon, the fabricator spaces the multiple elements apart from each other on the host substrate. In one embodiment, each of the multiple elements is fabricated from a second material having a refractive index greater than 4.5.

In accordance with further embodiments, the fabricator produces the host substrate using a material such as a Flouride-based material. The fabricator produces the multiple elements using a material such as a chalcogenide-based material having a refractive index greater than 4.5.

In accordance with further embodiments, disposing the multiple elements on the host substrate includes: producing the multiple elements to include a first set of elements of a first type structure and a second set of elements of a second type structure, the first set of elements and the second set of elements are disposed on the host substrate in accordance with a predefined pattern as previously discussed.

Although the elements and host substrate can be of any suitable shape, in one embodiment, the fabricator fabricates the first type of structure or structures on the host substrate to be a rectangular-shaped structure, the second type of structure or structures to be an H-shaped structure, and/or the third type of structure or structures to be cross-shaped structure as discussed herein.

In accordance with further embodiments, as previously discussed, a difference between the refractive index of the second material (used to fabricate the multiple elements) and the refractive index of the first material (used to fabricate the host substrate) is greater than 3.1.

The fabricator fabricates the optical device to be any suitable shape and size. For example, in one embodiment, the fabricator limits a thickness of the multiple elements to be less than 1000 nanometers.

In accordance with yet further embodiments, the fabricator produces the multiple elements such that a thickness of the multiple elements is less than or equal to one eighth of a free space wavelength to which the combination of the host material and the multiple elements is tuned to redirect inputted optical signals.

These and other more specific embodiments are disclosed in more detail below.

Note that any of the resources as discussed herein such as a fabricator (fabrication facility) can include one or more computerized devices, workstations, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium or hardware storage media disparately or co-located) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage media such as an optical medium (e.g., CD-ROM), floppy disk, hard disk, memory stick, memory device, etc., or other a medium such as firmware in one or more ROM, RAM, PROM, etc., and/or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations such as fabrication of one or more optical devices as discussed herein.

One embodiment includes a computer readable storage media and/or a system having instructions stored thereon to facilitate fabrication of one or more optical devices as discussed herein. For example, in one embodiment, the instructions, when executed by computer processor hardware, cause the computer processor hardware (such as one or more processor devices) associated with a fabricator to: receive a host substrate fabricated from an optically transmissive dielectric material; and dispose multiple elements on the host substrate, the multiple elements spaced apart from each other on the host substrate, each of the multiple elements fabricated from a second material having a refractive index greater than 4.5.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the method as discussed herein also can be embodied strictly as a software program, firmware, as a hybrid of software, hardware and/or firmware, or as hardware alone such as within a processor (hardware or software), or within an operating system or a within a software application.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

FIG. 15 is an example diagram illustrating an element disposed on a host substrate of an optical device according to embodiments herein.

FIG. 23 is an example diagram illustrating a pattern of fabricating different shaped elements on a host substrate of an optical device according to embodiments herein.

FIG. 27 is an example diagram illustrating a pattern of fabricating different shaped elements on a host substrate of an optical device according to embodiments herein.

Figure 1:
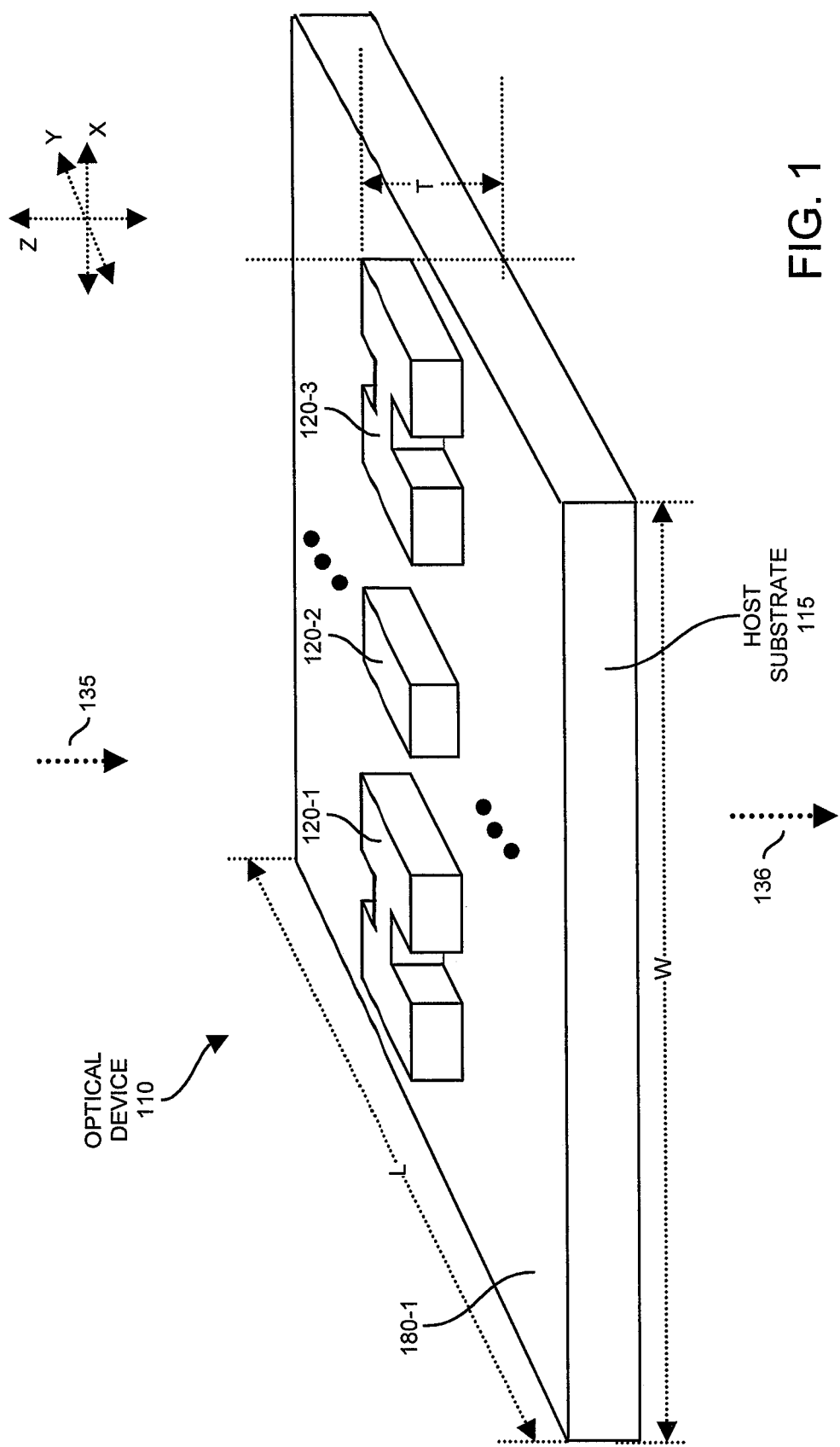
FIG. 1 is an example diagram illustrating a 3-D view of an optical device including multiple elements disposed on a host substrate according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

This disclosure includes the observation that traditional optical materials such as glass and polymers become opaque in the mid-IR range. Embodiments herein include a unique material combination of first material such as nanocrystalline PbTe (n=5.0, such as geometries disposed on a substrate) and second material such as a CaF$_2$ substrate (n=1.4), which offers a large refractive index contrast (such as greater than 2.5), such as broadband mid-IR transparency up to 9 microns, and compatibility with wafer-scale, high-throughput fabrication. With respect to device engineering and fabrication, embodiments herein provide an inherent tradeoff between phase coverage and optical efficiency in conventional Huygens metasurface structures.

Further embodiments herein include a novel two-component meta-atom design to overcome the above-mentioned limitations to achieve simultaneously full 360-degree phase coverage and near-unity optical transmission. Note that the optical devices as discussed herein can take any form such as diffractive beam deflectors, cylindrical lenses, aspheric lenses operating near the mid-IR band of 5.2 microns.

Material and design innovations as discussed herein support device features such as:

transmission efficiencies exceeding 80% and optical efficiencies up to 75% (non-AR-coated), comparable to state-of-the-art bulk mid-IR elements and representing a major improvement over previously reported transmissive meta-optics in the mid-IR or Huygens metasurfaces at optical frequencies; and an ultra-thin profile of ⅛ wavelength in thickness and an aspect ratio of less than 1.25, the smallest among dielectric metasurfaces.

first instance of a Huygens metasurface operating in the mid-IR;

first implementation of diffraction-limited focusing in the mid-IR using meta-optics; and first experimental realization of sub-wavelength imaging in the mid-IR using meta-optics.

Note further that embodiments herein can be applied to any suitable device applications such as optical devices operating in any suitable wavelength range. In one non-limiting example embodiment, the optical device as discussed herein is configured to support the mid IR wavelength range or other suitable wavelength range.

Now, more specifically, with reference to the figures, FIG. 1 is an example diagram illustrating a 3D view of an optical device according to embodiments herein.

As shown, the optical device 110 in this example embodiment includes a host substrate 115 fabricated from one or more optically transmissive, translucent, or transparent, etc., materials such as a dielectric material transparent in the IR range (such as mid IR range). In one example embodiment, the host substrate 115 is fabricated from material having a refractive index of less than 1.5, although the refractive index of the host substrate 115 can be any suitable greater than 1.5 in certain embodiments.

Additionally, as further shown, the optical device 110 includes multiple elements 120 (individually, referenced as element 120-1, element 120-2, element 120-3, 120-4, etc.) disposed on the host substrate 115.

By way of non-limiting example embodiment, each of the multiple elements 120 is fabricated from one or more optically transmissive, translucent, or transparent, etc., materials having a refractive index of greater than 4.0.

In one embodiment, a difference between the refractive index of the material used to fabricate the host substrate 115 and the material used to fabricate the multiple elements 120 is greater than 3.0.

In accordance with further embodiments, each of the multiple elements 120 is spaced apart from each other on the host substrate 110 to produce a desired pattern. Attributes (such as a distance between elements, number of elements, etc.) of the pattern of elements 120 as well as attributes (such as shape and size) of the multiple elements 120 themselves define how the corresponding optical device 110 redirects the incident optical signals 135 as transmitted (or redirected) optical signals 136 as an output.

Depending on the configuration of multiple elements 120 and host substrate 115, the optical device 110 is a device such as a lens, diffractive beam deflector, cylindrical lens, aspheric lens, etc.

Note that the surface 180-1 (such as a Huygens metasurface) of the host substrate 115 on which the multiple elements 120 reside can be any suitable shape. In one embodiment, the surface 180-1 of the host substrate 115 is substantially planar. Surface 180-2 is substantially planar as well. Alternatively, note that the surface 180-1 and/or surface 180-2 of the host substrate 115 can be any suitable shape such as curved, convex, etc.

In the embodiment shown in FIG. 1, the host substrate 115 of the optical device 110 is substantially planar. Thickness, T, in this example embodiment is substantially smaller than a Length (L) or Width (W) of the host substrate 115. The length and width of the host substrate 115 can be any suitable value on which any of one or more different types of multiple elements 120 are disposed thereon.

In accordance with further embodiments, a thickness of each of the multiple elements 120 is a portion of (such as less than or equal to) a free space wavelength to which the optical device 110 is tuned to redirect inputted optical signals 135 as outputted optical signals 136. For example, in one embodiment, such a thickness is less than or equal to one eighth of the free space wavelength. For example, a combination of the host substrate 110 and the multiple elements 120 are operable to redirect incident optical signals 135 as optical signal 136 in one or more different directions depending on attributes (such as size, shape, spacing, etc.) of the host substrate 115 and corresponding multiple elements 120 of optical device 110. The optical device 110 can be tuned (such as based on shape, size, spacing, etc., of elements 120) to operate in any suitable range of optical signals.

In one embodiment, the optical device 110 (such as host substrate 115 fabricated from a dielectric material and multiple elements 120 having a refractive index such as greater than 4.5) is operable to redirect one or more incident optical signals 135 of wavelengths in an Infrared range such as mid IR range (such as wavelengths between 2,500 and 8,000 nanometers) as one or more optical signals 136.

In accordance with further embodiments, the host substrate 115 and the multiple elements 120 can be any suitable material.

In one non-limiting example embodiment, the host substrate 115 is fabricated from a (compound) semiconductor material such GaAs, InP, InSb, GaSb, CdTe, ZnCdTe, etc.

In accordance with further embodiments, if desired, the material used to fabricate the host substrate 115 can include IR-transparent materials such as ZnS, ZnSe, MgF2, BaF2, NaCl, AgCl, AgBr, AgI, chalcogenide glasses, etc. Note that certain embodiments herein do not rely on low-index material (such as material having a refractive index of less than 1.5) to fabricate the host substrate 115 to operate, although the meta-atoms or multiple elements 129 as discussed herein each may have a refractive index greater than 4.0 as previously discussed.

In yet another non-limiting example embodiment, the host substrate 115 of the optical device 110 is fabricated from or includes a Flouride-based material such as Calcium Flouride ($CaF_2$) or other suitable dielectric material; each of the multiple elements 120 is fabricated from or includes a chalcogenide-based material (a chemical compound consisting of at least one chalcogen anion and at least one more electropositive element) such as Lead Telluride (PbTe) to achieve a refractive index of greater than 4.5.

In accordance with further embodiments, as mentioned, the refractive index of each of the multiple elements 120 can be any suitable value. In one embodiment, a difference between the refractive index of the second material used to fabricate the multiple elements 120 and the refractive index of the first material used to fabricate the host substrate 115 is greater than 2.5 to provide the properties as discussed herein.

In one embodiment, the combination of the host substrate 115 and the multiple elements 120 as disposed thereon provides an optical transmission efficiency of greater than 75% through the optical device 110 for wavelengths in the mid infrared wavelength range such as wavelengths between 3,000 to 8,000 nanometers).

The thickness, T, of the host substrate 115 and the multiple elements 120 can be any suitable value. In one non-limiting example embodiment, a thickness of the multiple elements (second material) is less than 1000 nanometers. Such a small form factor of the optical device 110 is useful in many suitable optical applications. As previously discussed, the optical device 110 is useful because it is easy to fabricate, yet it provides a low cost alternative to conventional optical devices that are heavy, non-planar, bulky, large in profile, etc.

Figure 28:
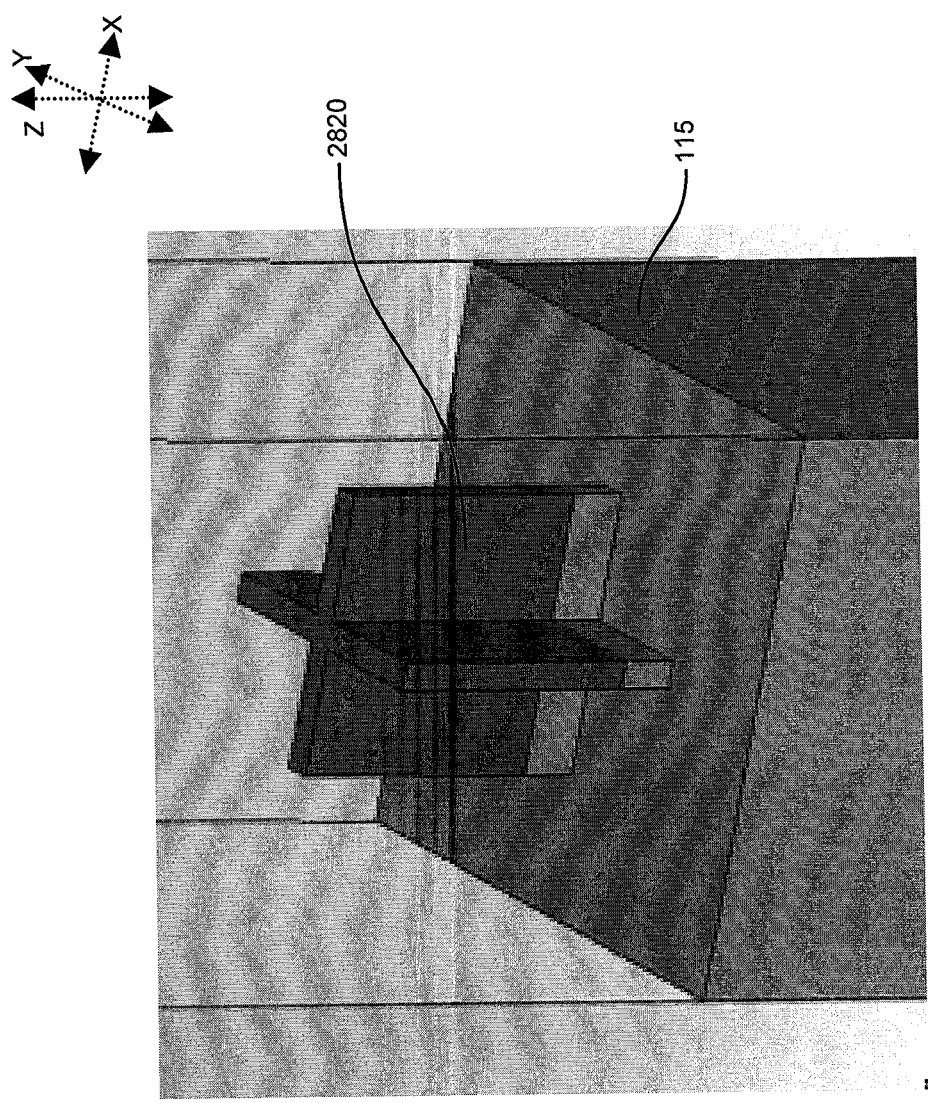
FIG. 28 is an example diagram illustrating a 3-D view of a cross-shaped element according to embodiments herein.

FIG. 28 is an example diagram illustrating a 3-D view of a cross element according to embodiments herein.

As previously discussed, multiple elements 120 can include elements of any shape and size. In one embodiment, one or more of the multiple elements 120 disposed on host substrate 115 is a cross-shaped structure 2820 as shown in FIG. 28. The cross-shaped structure 2820 is polarization independent.

Figure 29:
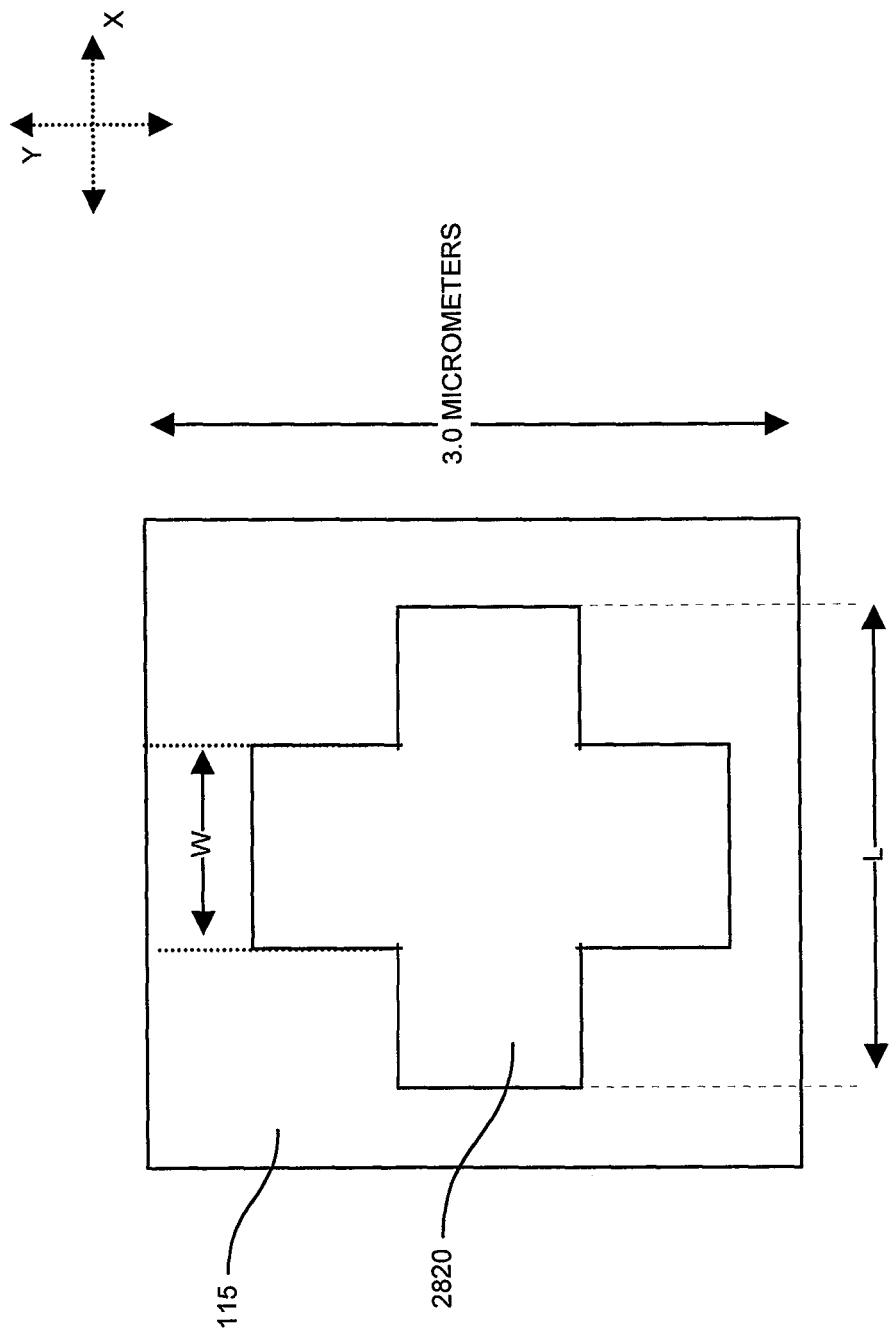
FIG. 29 is an example top view diagram illustrating a cross-shaped element disposed on a host substrate according to embodiments herein.

FIG. 29 optical device including an element disposed on a host substrate according to embodiments herein.

In this example embodiment, the length, L, and width, W, of the element 2820 are less than 3.0 micrometers as shown. However, note that the dimensions of W and L vary depending on the embodiment and the wavelength or wavelengths to which the corresponding optical device is tuned to redirect inputted optical signals.

Figure 2:
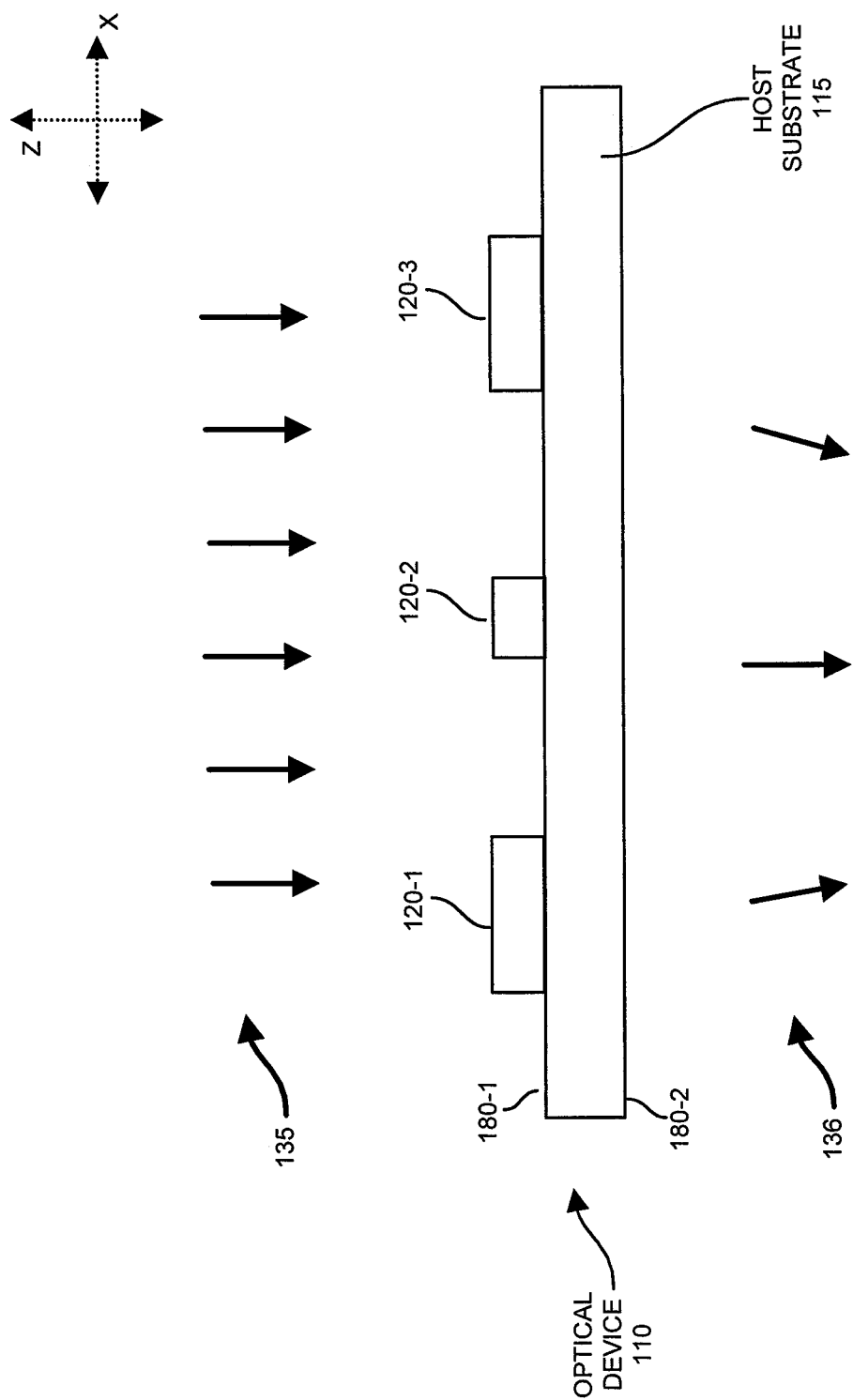
FIG. 2 is an example diagram illustrating a side view and functionality of an optical device according to embodiments herein.

FIG. 2 is an example diagram illustrating a side view of an optical device according to embodiments herein.

In a manner as previously discussed, optical device 110 receives and redirects inputted optical signal 135 as optical signals 136. Multiple elements 120 are disposed on surface 180-1, while no elements are disposed on surface 180-2.

Figure 3:
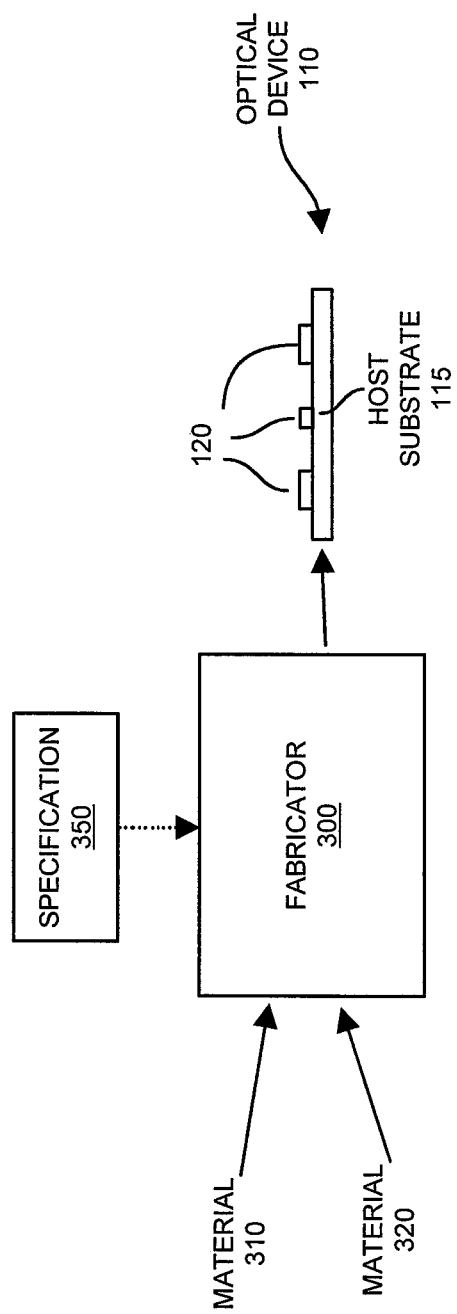
FIG. 3 is an example diagram illustrating a fabricator environment to fabricate the different types of optical devices as discussed herein.

FIG. 3 is an example diagram illustrating fabrication of an optical device by a fabricator according to embodiments herein. Note that the fabricator 300 fabricates any of the optical devices as discussed herein.

In this example embodiment, the fabricator 300 receives or fabricates host substrate 115 from first material 310. As previously discussed, the host substrate 115 can be fabricated from any suitable first material 310 having a refractive index of less than 1.5.

The fabricator 300 disposes the multiple elements 120 on the host substrate 115 in any desirable pattern. For example, in one embodiment, in accordance with fabrication specification 350 indicating how to fabricate the optical device 110, the fabricator 300 spaces the multiple elements 120 apart from each other on one or more surfaces, layers, etc., of the host substrate 115.

In one embodiment, as previously discussed, each of the multiple elements 120 is fabricated from the second material 320 having a refractive index greater than 4.0 or 4.5.

By further way of non-limiting example embodiment, the fabricator 300 can be configured to produce the substrate 115 using a Flouride-based material. The fabricator 300 can be configured to produce the multiple elements 120 using a chalcogenide-based material having a refractive index greater than 4.5.

In accordance with yet further embodiments, disposing the multiple elements 120 on the host substrate 115 includes: producing the multiple elements 120 to include a first set of elements of a first type structure and a second set of elements of a second type structure. As indicated by the specification 350, the fabricator 300 disposes the first set of elements and the second set of elements on the host substrate 115 on one or more surfaces of the host substrate 115 in accordance with a desired (predefined) pattern.

In one embodiment, although the elements 120 can be of any suitable shape, the fabricator 300 fabricates the first type of structure to be a rectangular-shaped structure (as viewed along the y-axis), the second type structure is an H-shaped structure (as viewed along the y-axis), and so on.

In accordance with further embodiments, in one embodiment as previously discussed, a difference between the refractive index of the second material and the refractive index of the first material is greater than 3.1.

The fabricator 300 fabricates the optical device 110 to be any suitable shape and size as specified by the specification 350. For example, in one embodiment, the fabricator 300 limits a thickness of the multiple elements 120 as previously discussed to be less than 1000 nanometers or other suitable thickness value.

In accordance with yet further embodiments, the fabricator 300 produces the multiple elements 120 such that a thickness of the multiple elements (along the y-axis) is less than or equal to one eighth of a free space wavelength to which the combination of the host substrate 115 and the multiple elements 120 is tuned to redirect inputted optical signals 135 as optical signals 136.

Figure 4:
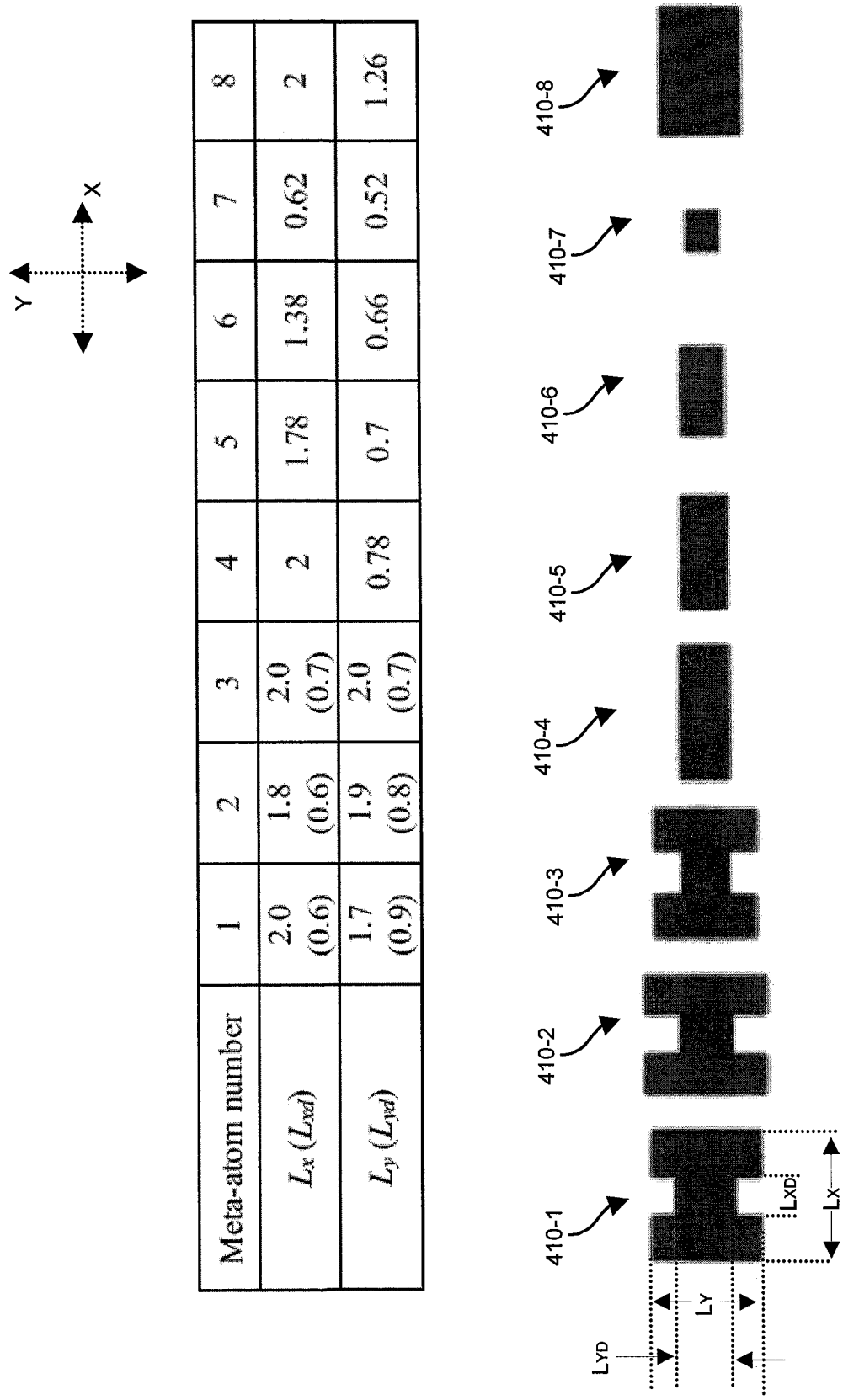
FIG. 4 is an example diagram illustrating different shaped elements and example dimensions according to embodiments herein.

FIG. 4 is an example diagram illustrating a non-exhaustive list of different possible shapes/sizes of elements disposed on a host substrate of an optical device according to embodiments herein.

More specifically, the one or more elements 120 disposed on the host substrate 115 can be any suitable shape and size such as structure 410-1 (H-shaped as viewed along the z-axis), structure 410-2 (H-shaped as viewed along the z-axis), structure 410-3 (H-shaped as viewed along the z-axis), structure 410-4 (rectangular-shaped as viewed along the z-axis), structure 410-5 (rectangular-shaped as viewed along the z-axis), structure 410-6 (rectangular-shaped as viewed along the z-axis), structure 410-7 (rectangular-shaped as viewed along the z-axis), and structure 410-8 (rectangular-shaped as viewed along the z-axis).

Another example embodiment of a suitable structure for any of one or more multiple elements 120 is shown and discussed with respect to FIGS. 28 and 29. Note that any number of rectangular-shaped structures can be combined or integrated together.

For example, the H-shaped structure is a combination of 3 rectangular-shaped structures integrated together to form one type of a bar-shaped structure, which is then used as basis to fabricate one or more of the multiple elements 120 as discussed herein. The cross-shaped structure 2820 in FIG. 28 is a combination of 2 rectangular-shaped structures and is another type of bar-shaped structure.

As further discussed below in more detail with respect to FIG. 4, each of the structures 410 has a different associated meta-atom number. For example, the structure 410-1 represents a meta-atom #1; the structure 410-2 represents meta-atom #2; the structure 410-3 represents meta-atom #4; the structure 410-4 represents meta-atom #4; the structure 410-5 represents meta-atom #5; the structure 410-6 represents meta-atom #6; the structure 410-7 represents meta-atom #7; the structure 410-8 represents meta-atom #8. Combinations of the different structures 410 can be included on one or more surfaces of the optical device 110 to provide desired functionality.

Table 430 indicates example dimensions (in micrometers) associated with the different shaped elements 410.

Referring again to FIG. 1, in one embodiment, the multiple elements 120 fabricated from the material having a refractive index greater than 4.0 includes a first set of elements of a first type structure (such as structure 410-1) and a second set of elements of a second type structure (such as structure 410-6). The first set of elements and the second set of elements disposed on the host substrate 115 create a predefined pattern to redirect incident optical signals 135 passing through the optical device 110 as optical signals 136.

Figure 5:
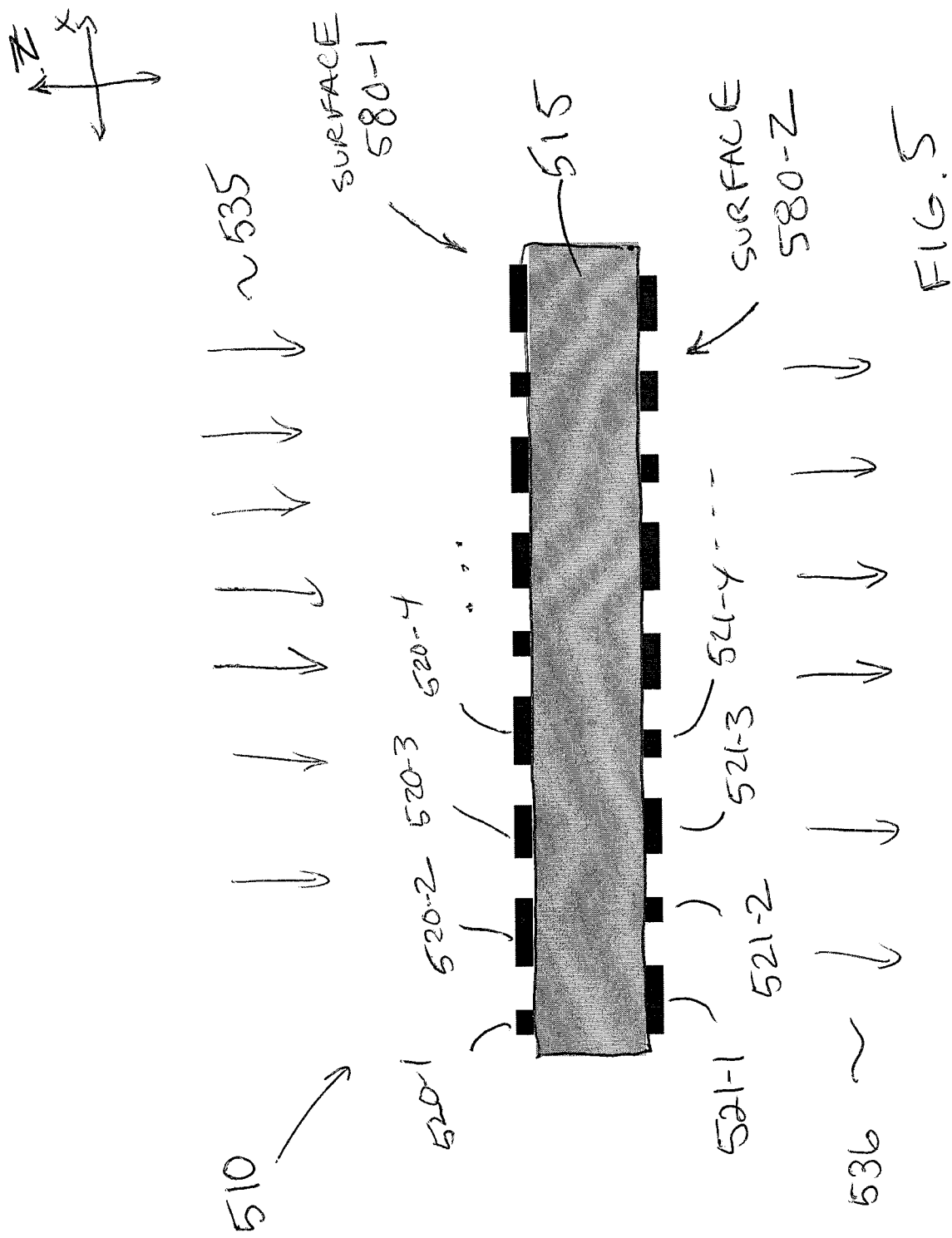
FIG. 5 is an example diagram illustrating a multi-sided optical device according to embodiments herein.

FIG. 5 is an example diagram illustrating a side view of an optical device according to embodiments herein.

As shown, the example embodiment of the optical device 510 in FIG. 5 includes multiple elements 520 and multiple elements 530 disposed on opposite facings of host substrate 515. For example, a first surface 580-1 or facing (such as a meta-surface) of the optical device 510 includes, thereon, a first set of elements 520 (such as element 520-1, element 520-2, element 520-3, element 520-4, etc.) fabricated from any suitable material having a refractive index greater than 4.5. The first set of elements 520 includes any number of different types of structures as previously discussed. A second surface 580-2 (meta-surface) of the optical device 510 includes, thereon, a second set of elements 521 (such as element 521-1, element 521-2, element 521-3, element 521-4, etc.) fabricated from any suitable material having a refractive index greater than 4.5. The second set of elements 521 includes any number of different types of structures as previously discussed.

In a manner as previously discussed, the first set of elements 520 fabricated from materials 310 (such as one or more material having a refractive index greater than 4.5). The multiple elements 520 can include one or more different types of structural elements such as previously discussed in FIG. 4. The second set of elements 521 fabricated from materials 320 (such as one or more material having a refractive index greater than 4.5) can include one or more different types of structural elements such as previously discussed in FIG. 4.

Accordingly, embodiments herein include an optical device 510 including a host substrate 515. Multiple elements 520 are disposed on a first surface 580-1 (such as a first meta-surface) of the host substrate 515. Multiple elements 521 are disposed on a second surface 580-2 (such as a second meta-surface) of the host substrate 515. Optical device 510 is configured to redirect input optical signals 535 as outputted optical signals 536.

Figure 6:
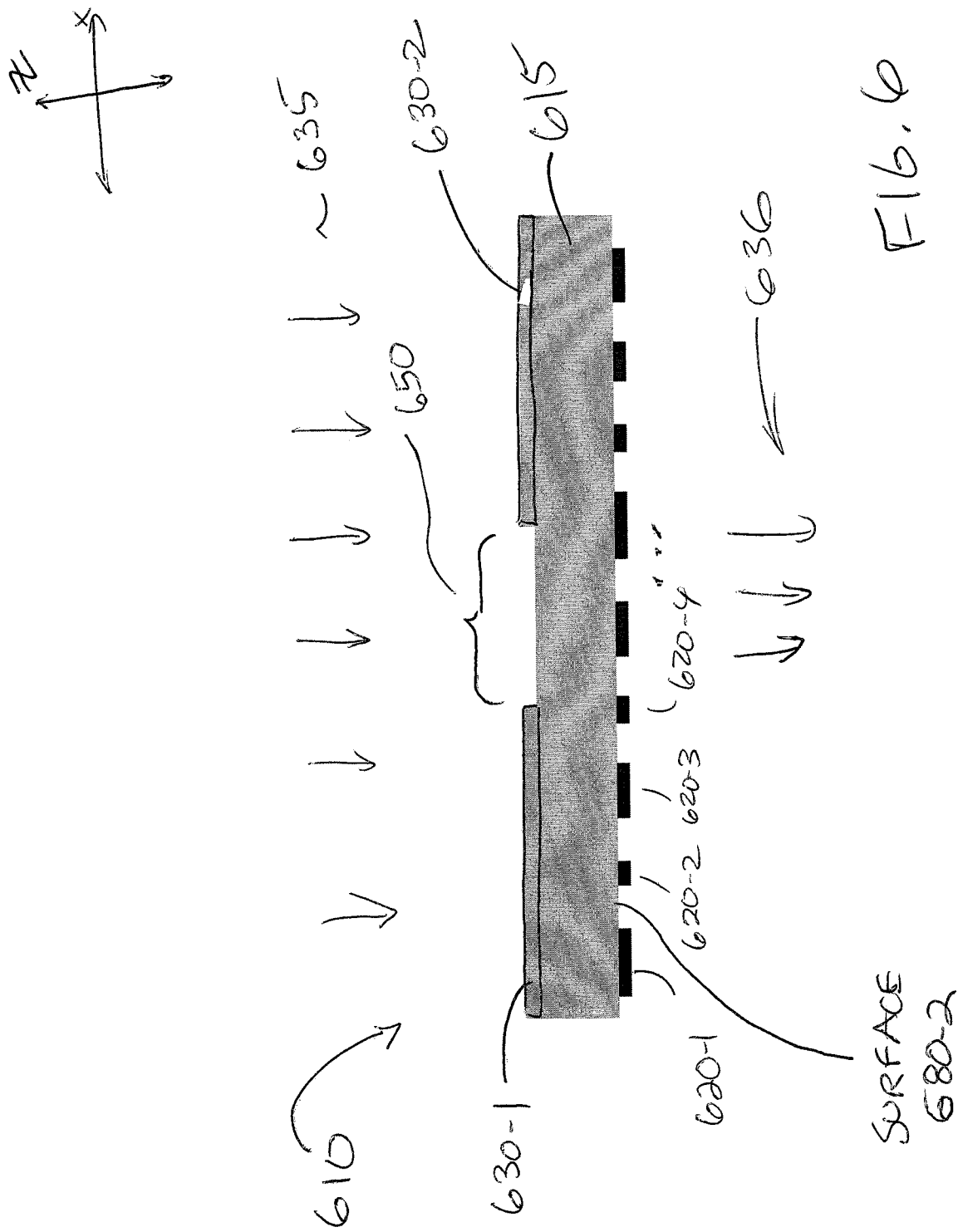
FIG. 6 is an example diagram illustrating an optical device including an aperture according to embodiments herein.

FIG. 6 is an example diagram illustrating a side view of an optical device including an aperture according to embodiments herein.

As shown, the example embodiment of the optical device 610 in FIG. 6 includes host substrate 615. An aperture 650 (opening) in the layer of material 630 on substrate 615 allows input optical signals 635 to pass to host substrate 615 and elements 620. Layer of material 630 (such as metal or other suitable opaque material as indicated by layer 630-1 and 630-2) defines aperture 650 and blocks a corresponding portion of optical signals 535. Multiple elements 620 are disposed on the second surface 580-2 (such as a meta-surface) of the host substrate 615 to redirect (in a different direction) input optical signals 635 passing through the aperture 650 as outputted optical signals 636.

In a similar manner as previously discussed, host substrate 615 is fabricated from first materials 310 (such as one or more materials having a refractive index of less than 1.5). Multiple elements 620 (such as element 620-1, element 620-2, element 620-3, element 620-4, etc.) are fabricated from second materials 320 (such as one or more materials having a refractive index of greater than 4.0). Depending on the desired characteristics of optical device 610, the multiple elements 620 can include one or more different types of structural elements such as previously discussed in FIG. 4.

Figure 7:
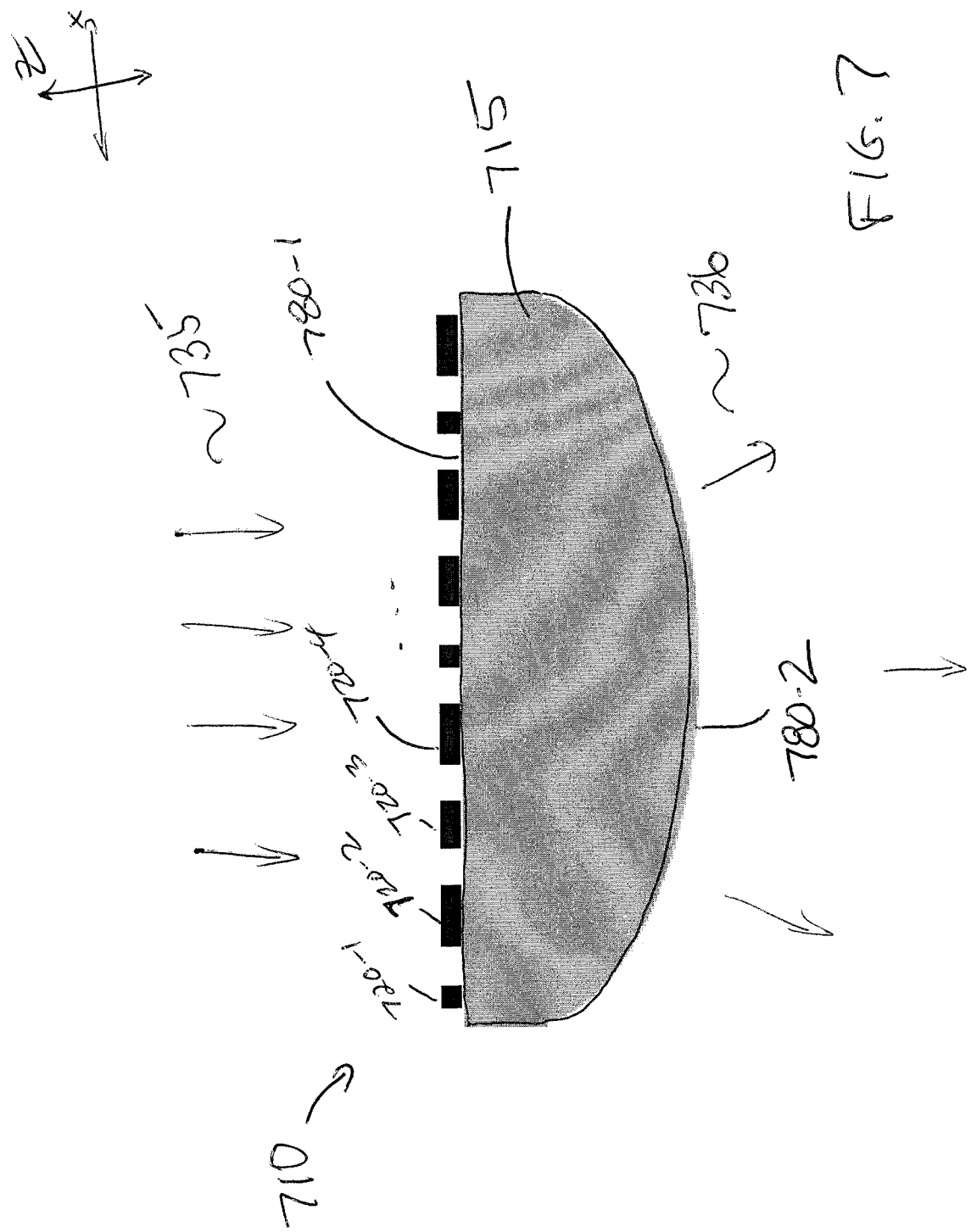
FIG. 7 is an example diagram illustrating an optical device including a curved surface according to embodiments herein.

FIG. 7 is an example diagram illustrating a side view of an optical device including a curved surface according to embodiments herein.

As shown, the example embodiment of the optical device 710 in FIG. 7 includes host substrate 715. Multiple elements 720 (such as element 720-1, element 720-2, element 720-3, element 720-4, etc.) are disposed on a first surface 780-1 (such as a first planar meta-surface) of the host substrate 715. Surface 780-2 is a curved surface (such as convex). Optical device 710 redirects inputted optical signals 735 as outputted optical signals 736 from curved surface 780-2.

In a similar manner as previously discussed, host substrate 715 is fabricated from first materials 310 (such as one or more materials having a refractive index of less than 1.5). Multiple elements 720 are fabricated from second materials 320 (such as one or more materials having a refractive index of greater than 4.5). Depending on the desired characteristics of optical device 710, the multiple elements 720 can include one or more different types of structural elements such as previously discussed in FIG. 4.

Figure 8:
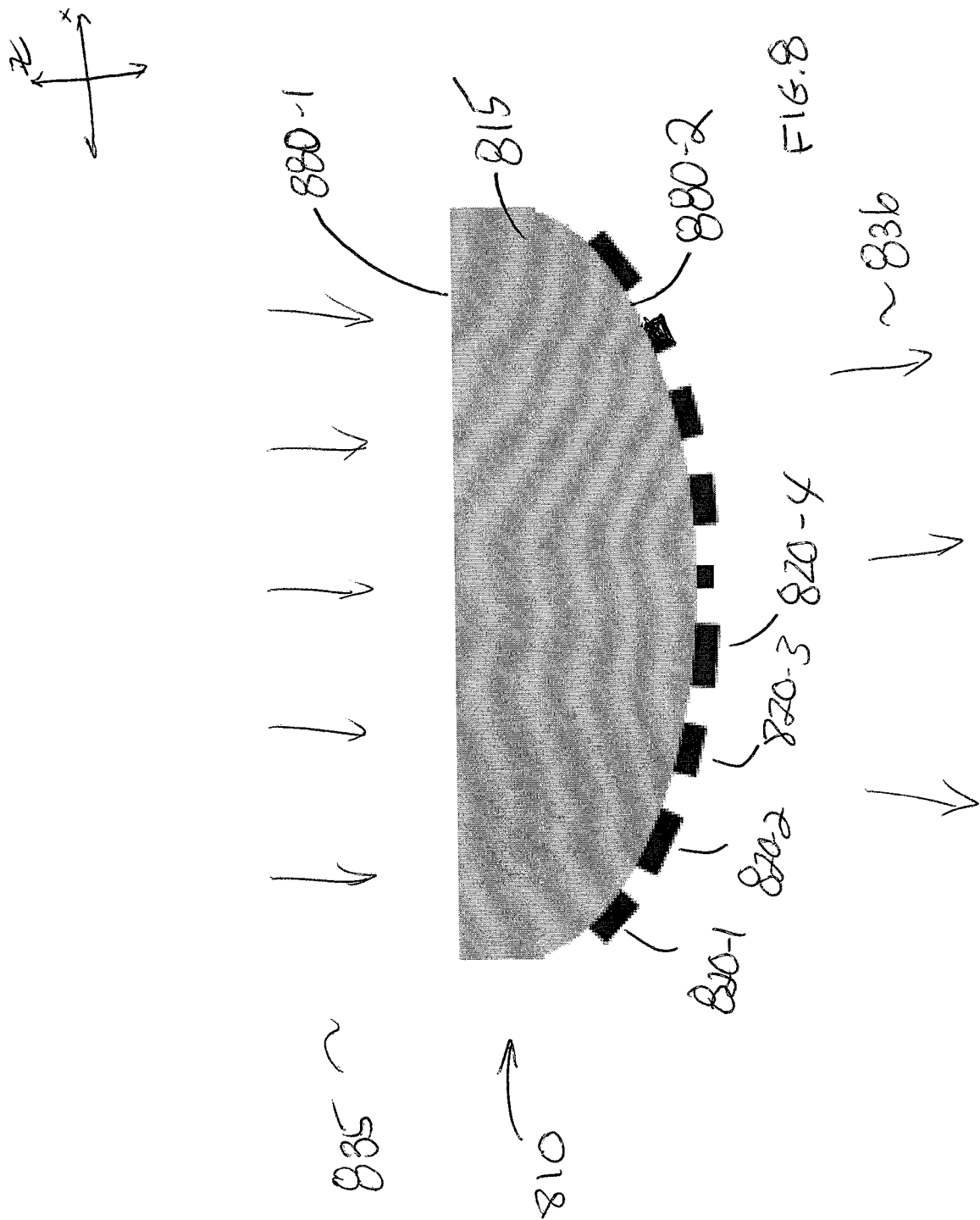
FIG. 8 is an example diagram illustrating an optical device including a curved surface on which multiple elements reside according to embodiments herein.

FIG. 8 is an example diagram illustrating a side view of an optical device including a curved surface according to embodiments herein.

As shown, the example embodiment of the optical device 810 in FIG. 8 includes host substrate 815. Host substrate 815 includes a planar surface 880-1 and curved surface 880-2. Multiple elements 820 (such as element 820-1, element 820-2, element 820-3, element 820-4, etc.) are disposed on surface 880-2 (such as a curved meta-surface) of the host substrate 815. Optical device 810 redirects input optical signals 835 as outputted optical signals 836.

In a similar manner as previously discussed, host substrate 815 is fabricated from first materials 310 (such as one or more materials having a refractive index of less than 1.5). Multiple elements 820 are fabricated from second materials 320 (such as one or more materials having a refractive index of greater than 4.5). Depending on the desired characteristics of optical device 810, the multiple elements 820 can include one or more different types of structural elements such as previously discussed in FIG. 4.

Figure 9:
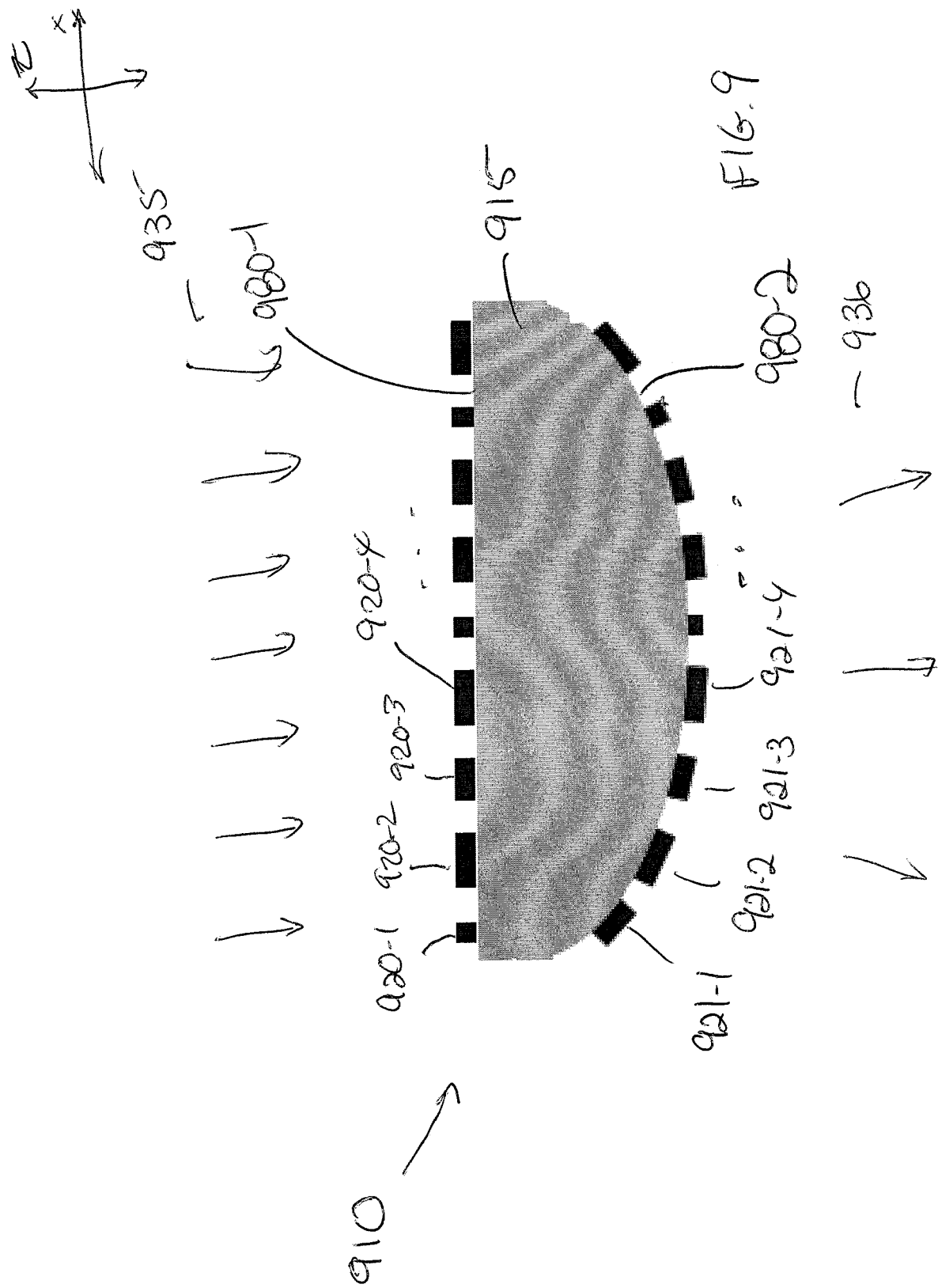
FIG. 9 is an example diagram illustrating a multi-sided optical device including a curved surface according to embodiments herein.

FIG. 9 is an example diagram illustrating a side view of a multi-sided optical device including a curved surface according to embodiments herein.

As shown, the example embodiment of the optical device 910 in FIG. 9 includes host substrate 915. Host substrate 915 includes a planar surface 980-1 and curved surface 980-2. Multiple elements 920 (such as element 920-1, element 920-2, element 920-3, element 920-4, etc.) are disposed on surface 980-1 (such as a planar meta-surface) of the host substrate 915. Multiple elements 921 (such as element 921-1, element 921-2, element 921-3, element 921-4, etc.) are disposed on surface 980-2 (such as a curved meta-surface) of the host substrate 915. Optical device 910 redirects input optical signals 935 as outputted optical signals 936.

In a similar manner as previously discussed, host substrate 915 is fabricated from first materials 310 (such as one or more materials having a refractive index of less than 1.5). Multiple elements 920 and 930 are fabricated from second materials 320 (such as one or more materials having a refractive index of greater than 4.5). Depending on the desired characteristics of optical device 810, the multiple elements 920 and 930 can include one or more different types of structural elements such as previously discussed in FIG. 4.

Figure 10:
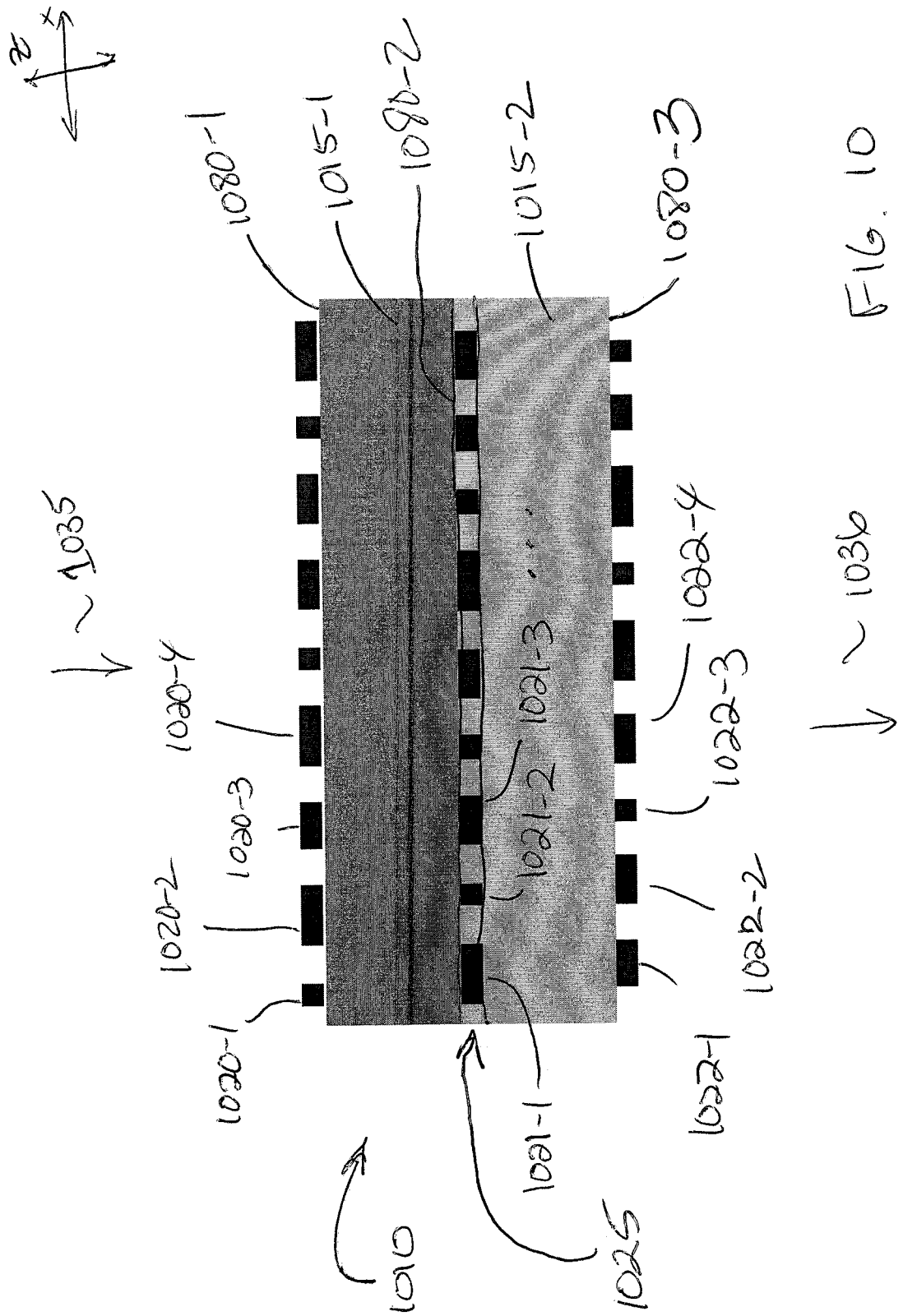
FIG. 10 is an example diagram illustrating a multi-layered optical device according to embodiments herein.

FIG. 10 is an example diagram illustrating a side view of a multi-layered optical device including a curved surface according to embodiments herein.

As shown, the example embodiment of the optical device 1010 in FIG. 10 includes multiple layers such as host substrate 1015-1 and host substrate 1015-2. Host substrate 1015-1 includes a planar surface 1080-1, planar surface 1080-2. Host substrate 1015-2 includes planar surface 1080-3.

Multiple elements 1120 (such as element 1020-1, element 1020-2, element 1020-3, element 1020-4, etc.) are disposed on surface 1080-1 (such as a planar meta-surface) of the host substrate 1015-1. Multiple elements 1021 (such as element 1021-1, element 1021-2, element 1021-3, element 1021-4, etc.) are disposed on surface 1080-3 (such as a planar meta-surface) of the host substrate 1015-1.

Connection layer 1025 couples the host substrate 1015-2 to host substrate 1015-1. The connection layer 1025 can be fabricated from air or a layer of optical material (such as an optical adhesive layer).

Multiple elements 1022 (such as element 1022-1, element 1022-2, element 1022-3, element 1022-4, etc.) are disposed on surface 1180-3 (such as a planar meta-surface) of the host substrate 1015-2.

Optical device 1010 redirects input optical signals 1035 as outputted optical signals 1036.

In a similar manner as previously discussed, host substrates 1015-1 and 1015-2 are fabricated from first materials 310 (such as one or more materials having a refractive index of less than 1.5). Multiple elements 1020, 1021, and 1102 are fabricated from second materials 320 (such as one or more materials having a refractive index of greater than 4.5). Depending on the desired characteristics of optical device 1010, the sets of multiple elements 1020, 1021, and 1022 can each include one or more different types of structural elements such as previously discussed in FIG. 4.

Figure 11:
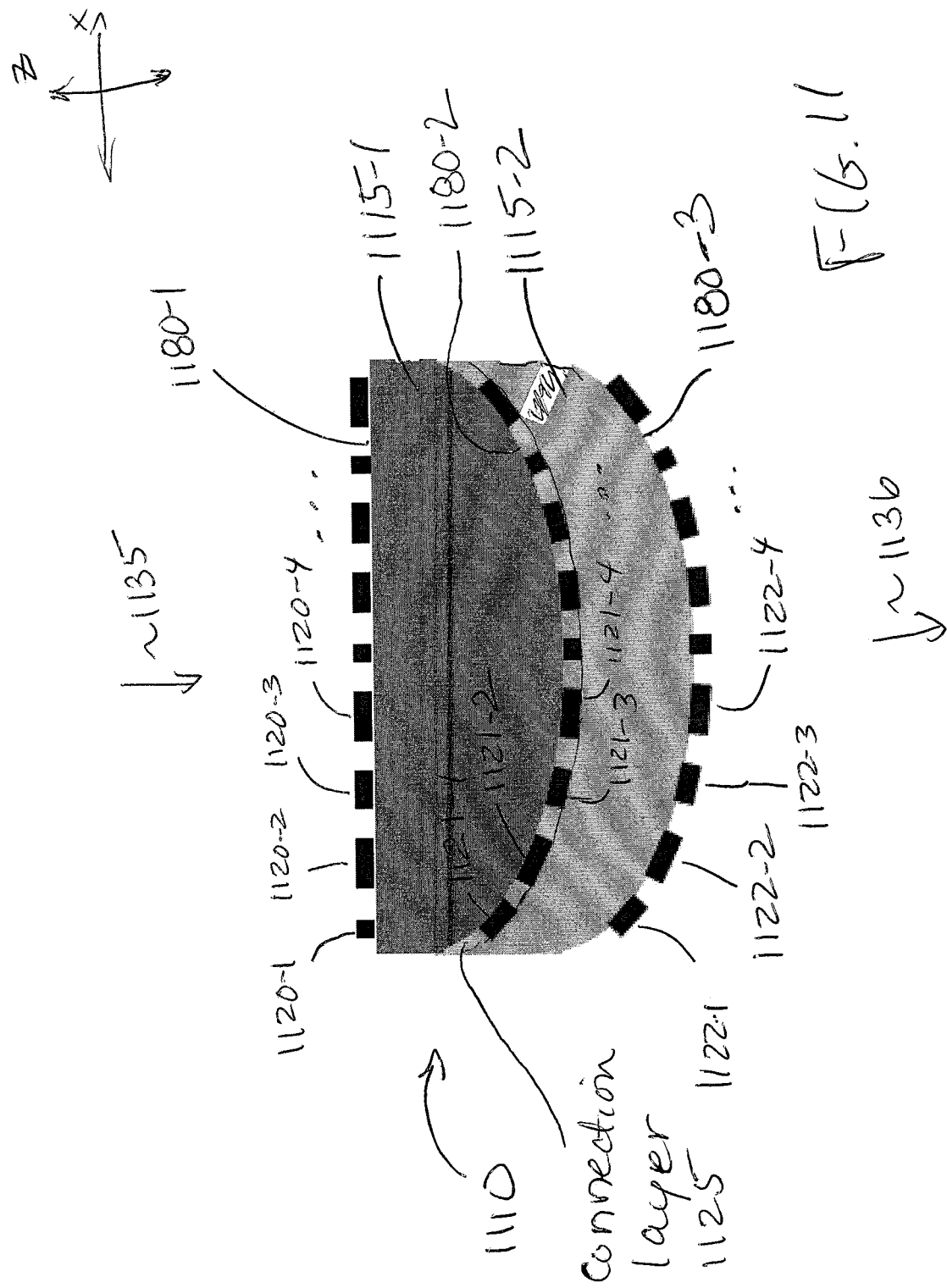
FIG. 11 is an example diagram illustrating a multi-layered optical device including multiple curved surfaces according to embodiments herein.

FIG. 11 is an example diagram illustrating a side view of a curved multi-layered optical device including a curved surface according to embodiments herein.

As shown, the example embodiment of the optical device 1110 in FIG. 11 includes multiple layers such as host substrate 1115-1 and host substrate 1115-2. Host substrate 1115-1 includes a planar surface 1180-1 and curved surface 1180-2.

Multiple elements 1120 (such as element 1120-1, element 1120-2, element 1120-3, element 1120-4, etc.) are disposed on surface 1180-1 (such as a planar meta-surface) of the host substrate 1115-1.

Multiple elements 1121 (such as element 1121-1, element 1121-2, element 1121-3, element 1121-4, etc.) are disposed on surface 1180-2 (such as a curved meta-surface) of the host substrate 1115-1.

Connection layer 1125 couples the host substrate 1115-2 to host substrate 1115-1. The connection layer 1125 can be fabricated from air or a layer of optical material (such as an optical adhesive layer).

Multiple elements 1122 (such as element 1122-1, element 1122-2, element 1122-3, element 1122-4, etc.) are disposed on surface 1180-3 (such as a curved meta-surface) of the host substrate 1115-2.

Optical device 1110 redirects input optical signals 1135 as outputted optical signals 1136.

In a similar manner as previously discussed, host substrates 1115-1 and 1115-2 are fabricated from first materials 310 (such as one or more materials having a refractive index of less than 1.5). Multiple elements 1120, 1121, and 1122 are fabricated from second materials 320 (such as one or more materials having a refractive index of greater than 4.5). Depending on the desired characteristics of optical device 1110, the sets of multiple elements 1120, 1121, and 1122 can each include one or more different types of structural elements such as previously discussed in FIG. 4.

Figure 12:
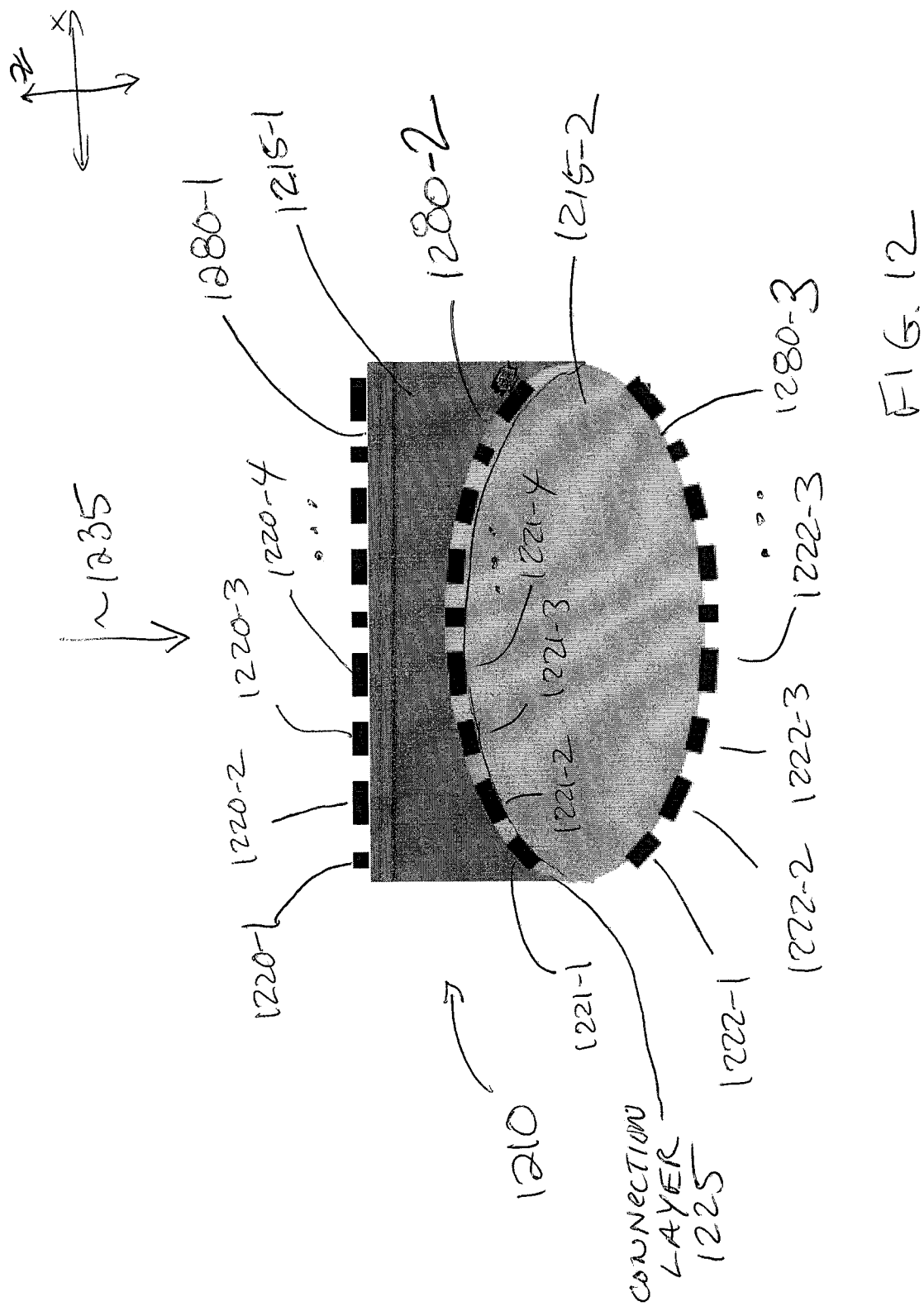
FIG. 12 is an example diagram illustrating a multi-layered optical device including a curved surface according to embodiments herein.

FIG. 12 is an example diagram illustrating a side view of a curved multi-layered optical device including a curved surface according to embodiments herein.

As shown, the example embodiment of the optical device 1210 in FIG. 12 includes multiple layers such as host substrate 1215-1 and host substrate 1215-2.

Host substrate 1215-1 includes a planar surface 1280-1 and curved surface 1280-2. Multiple elements 1220 (such as element 1220-1, element 1220-2, element 1220-3, element 1220-4, etc.) are disposed on surface 1280-1 (such as a planar meta-surface) of the host substrate 1215-1.

Multiple elements 1221 (such as element 1221-1, element 1221-2, element 1221-3, element 1221-4, etc.) are disposed on surface 1280-2 (such as a curved meta-surface) of the host substrate 1215-1.

Connection layer 1225 couples the host substrate 1215-2 to host substrate 1215-1. The connection layer 1225 can be fabricated from air or a layer of optical material (such as an optical adhesive layer).

Multiple elements 1222 (such as element 1222-1, element 1222-2, element 1222-3, element 1222-4, etc.) are disposed on surface 1280-3 (such as a curved meta-surface) of the host substrate 1215-2.

Optical device 1210 redirects input optical signals 1235 as outputted optical signals 1236.

In a similar manner as previously discussed, host substrates 1215-1 and 1215-2 are fabricated from first materials 310 (such as one or more materials having a refractive index of less than 1.5). Multiple elements 1220, 1221, and 1222 are fabricated from second materials 320 (such as one or more materials having a refractive index of greater than 4.5). Depending on the desired characteristics of optical device 1210, the sets of multiple elements 1220, 1221, and 1222 can each include one or more different types of structural elements such as previously discussed in FIG. 4.

Figure 13:
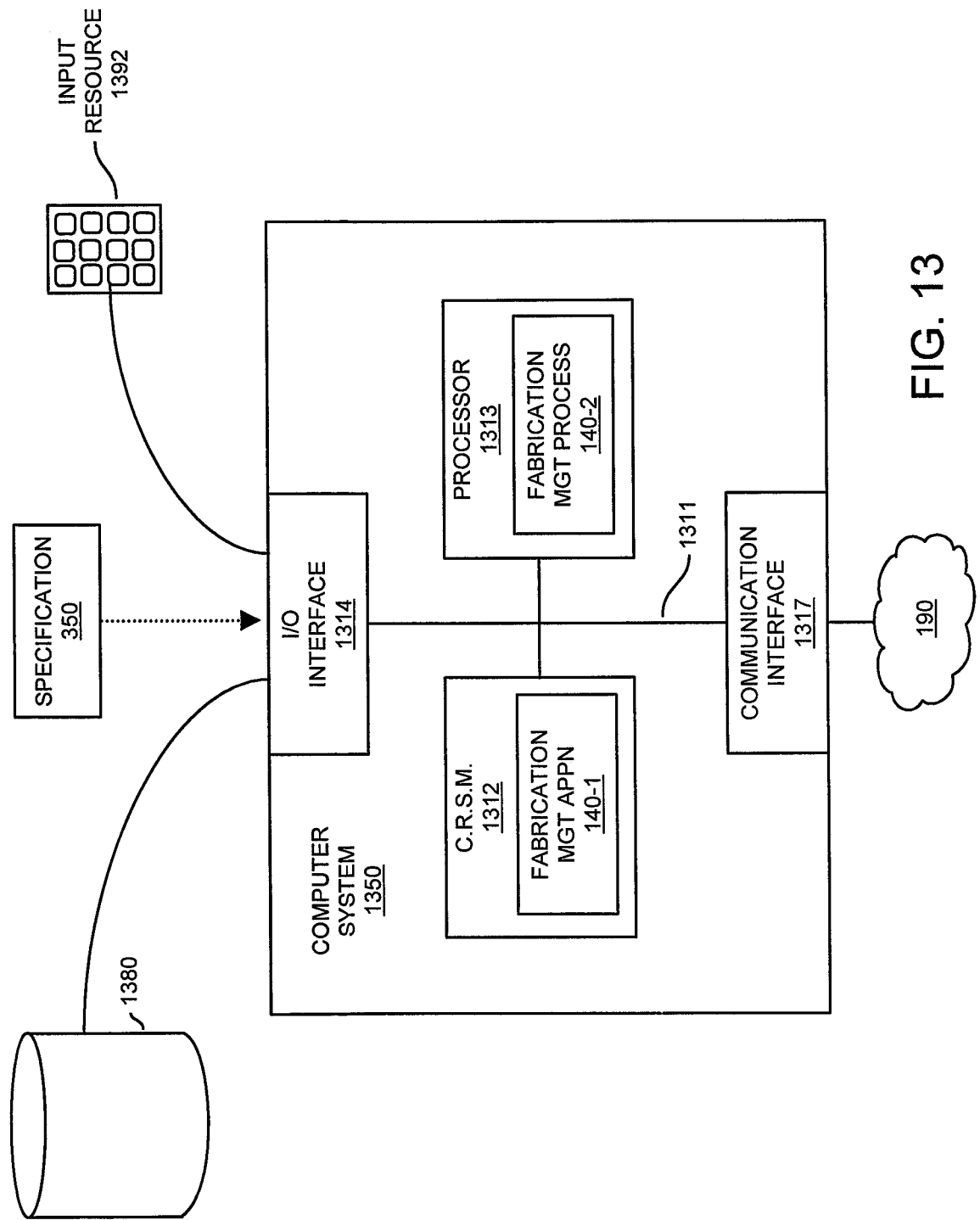
FIG. 13 is a diagram illustrating example computer architecture associated with a fabrication facility to execute any operations according to embodiments herein.

FIG. 13 is an example block diagram of a computer system for implementing any of the operations as discussed herein according to embodiments herein.

Any of the resources as discussed herein can be configured to include a processor and executable instructions to carry out the different operations as discussed herein.

As shown, computer system 1350 (such as operated by a respective fabricator or fabrication facility) of the present example can include an interconnect 1311 that couples computer readable storage media 1312 such as a non-transitory type of media (i.e., any type of hardware storage medium) in which digital information can be stored and retrieved, a processor 1313, I/O interface 1314, and a communications interface 1317. I/O interface 1314 supports connectivity to repository 1380 and input resource 1392.

Computer readable storage medium 1312 can be any hardware storage device such as memory, optical storage, hard drive, floppy disk, etc. In one embodiment, the computer readable storage medium 1312 stores instructions and/or data.

As shown, computer readable storage media 1312 can be encoded with fabrication management application 140-1 (e.g., including instructions) to carry out any of the operations as discussed herein.

During operation of one embodiment, processor 1313 accesses computer readable storage media 1312 via the use of interconnect 1311 in order to launch, run, execute, interpret or otherwise perform the instructions in fabrication management application 140-1 stored on computer readable storage medium 1312. Execution of the fabrication management application 140-1 produces fabrication management process 140-2 to carry out any of the operations and/or processes as discussed herein.

Those skilled in the art will understand that the computer system 1350 can include other processes and/or software and hardware components, such as an operating system that controls allocation and use of hardware resources to fabrication management application 140-1.

In accordance with different embodiments, note that computer system may be or included in any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 850 may reside at any location or can be included in any suitable resource in any network environment to implement functionality as discussed herein.

Functionality supported by the different resources will now be discussed via flowcharts in FIG. 14. Note that the steps in the flowcharts below can be executed in any suitable order.

Figure 14:
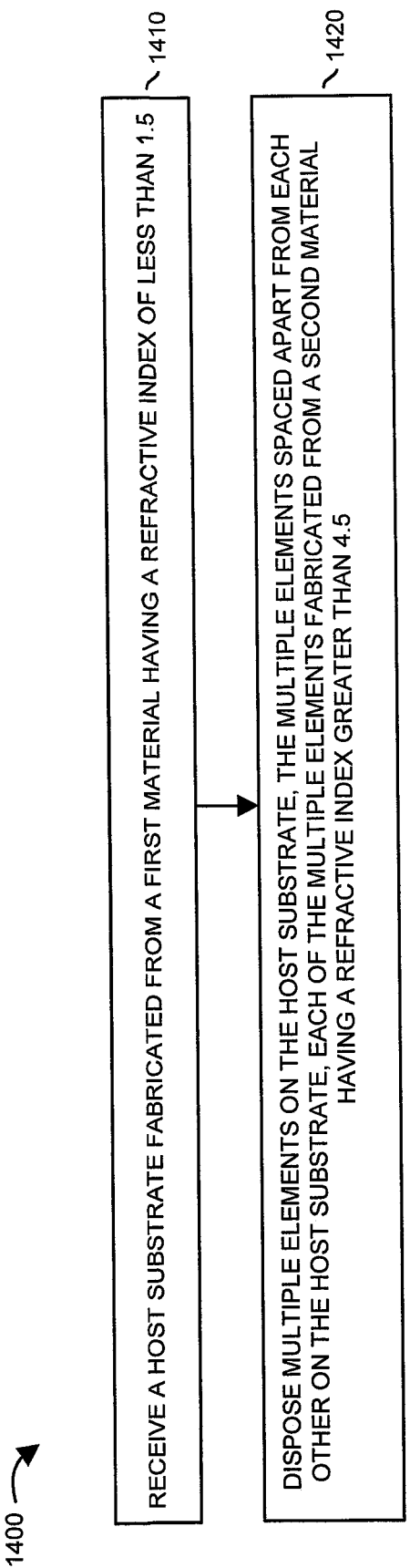
FIG. 14 is an example diagram illustrating a method according to embodiments herein.

FIG. 14 is a flowchart 1400 illustrating an example method according to embodiments. Note that there will be some overlap with respect to concepts as discussed above.

In processing operation 1410, a fabricator 300 (such as executing the fabrication management application 140-1) receives or produces a host substrate 115 via first material 310 having a refractive index of less than 1.5.

In processing operation 1940, via one or more processing operations, the fabricator 300 disposes multiple elements 120 on the host substrate 115. In one embodiment, the fabricator 310 spaces the multiple elements 120 apart from each other to form an appropriate pattern of elements on the host substrate 115 in accordance with specification 350. Each of the multiple elements 120 is fabricated from a second material 320 having a refractive index greater than 4.5.

Further Example Embodiments

The mid-infrared (mid-IR) is a strategically important band for numerous applications ranging from night vision to biochemical sensing. Unlike visible or near-infrared optical parts which are commonplace and economically available off-the-shelf, mid-IR optical devices often require exotic materials or complicated processing, which accounts for their high cost and inferior quality compared to their visible or near-infrared counterparts. Embodiments herein include a Huygens metasurface platform (any of the optical devices as discussed herein) capable of fulfilling a diverse set of optical functions in the mid-IR.

In certain embodiments, as previously discussed, any of the meta-optical elements are constructed using high-index chalcogenide films deposited on fluoride host substrates: the choices of wide-band transparent materials allow the design to be scaled across a broad infrared spectrum. Capitalizing on a novel two-component Huygens' meta-atom design, the meta-optical devices as discussed herein feature an ultra-thin profile (x/8 in thickness, where x is the free-space wavelength to which the optical device is tuned) and measured optical efficiencies up to 75% in transmissive mode, both of which represent major improvements over state-of-the-art. Certain embodiments herein include a mid-IR transmissive meta-lenses (optical device) with diffraction-limited focusing and imaging performance.

The mid-infrared spectral region (such as wavelengths spanning 3,000-8,000 nanometers in wavelength) contains the characteristic vibrational absorption bands of most molecules as well as two atmospheric transmission windows, and is therefore of critical importance to many technological applications such as spectroscopic sensing, thermal imaging, free space communications, and infrared countermeasures. It is noted again that conventional optical devices operating in the mid-IR band often present a technical challenge for optical engineers. Since most traditional optical materials including silicate glasses and optical polymers become opaque at wavelengths greater than 3 um (micrometers), mid-IR optical components are either made of specialty materials such as chalcogenides or halides whose processing technologies are less mature, or require complicated fabrication methods such as diamond turning (e.g. in the cases of silicon or germanium optics). Consequently, unlike visible or near-infrared optical parts which are commonplace and economically available off-the-shelf, conventional mid-IR optics are plagued by much higher costs and often inferior performance compared to their visible or near-infrared counterparts.

In contrast to conventional techniques, embodiments herein include high-efficiency mid-IR transmissive optics based on dielectric Huygens metasurfaces (HMS). This disclosure includes the observation that, with its exceptionally high refractive index exceeding 5, a material such as PbTe is ideally suited for creating dielectric meta-atoms supporting high-quality Mie resonances. $CaF_2$ has a low index of 1.4: the large index contrast between them contributes to the ultra-thin profile of the so-called meta-atoms. This material pair also exhibits low optical attenuation from 3 to 9 um optical wavelengths, compatible with transmissive metasurface designs across the mid-IR band. The material choice further facilitates scalable manufacturing of meta-optics: such as on large-area wafers (on full 6" wafers), high-throughput (growth rate ~100 nm/min) PbTe film deposition via simple single source thermal evaporation and wafer-scale lithographic patterning of the film, and optical quality $CaF_2$ substrates are now commercially available with diameters up to 4", although any size is theoretically possible with proper fabrication equipment.

In addition to material innovation, embodiments herein include demonstration of one or more HMS (Huygens MetaSurfaces) and use of same in the mid-IR range, which provides significant performance improvement over conventional HMS devices at optical frequencies leveraging a novel two-component meta-atom design. Unlike conventional dielectric metasurfaces based on waveguiding effects which mandate delicate high-aspect-ratio nanostructures to cover full 360-degree phase, the concept of Huygens metasurfaces, embodiments herein enable good control of electromagnetic wave propagation in a low-profile surface layer with deep sub-wavelength thickness. One feature of an HMS is that near-unity optical efficiency is possible in such a metasurface comprising meta-atoms possessing both electric dipole (ED) and magnetic dipole (MD) resonances.

In accordance with other embodiments, a two-component meta-atom design and optical device as discussed herein includes one of or both rectangular and H-shaped meta-atom structures. Again, see FIG. 4. This novel approach significantly boosts the optical transmittance of HMS to above 80% with overall optical efficiencies up to 75%, while maintaining a record thin profile with a thickness of x/8, where x is the free-space wavelength to which the optical device is tuned. This unique combination of judicious material choice and innovative HMS design allow high-performance transmissive meta-optics operating near the mid-IR wavelength of, for example, 5.2 um (micrometers).

Huygens MetaSurface Design

FIG. 15 is an example diagram illustrating of a rectangular meta-atom structure (120-2) in the form of a PbTe block (having a top layer and bottom layer) adhered to a $CaF_2$ host substrate 115. In this non-limiting example embodiment, the size of a unit cell of a corresponding optical device, P, is 2.5 um along both axes x and y, less than x/2 to eliminate undesired diffraction orders. Total thickness of the PbTe block is fixed at 650 nm or ⅛ of the free-space wavelength (x=5.2 um), which are the smallest among dielectric metasurfaces reported to date. As mentioned, note again that the dimensions of the element 120-2 can vary depending on the embodiment.

To ensure that the rectangular meta-atom indeed supports both electric dipole (ED) and magnetic dipole (MD) resonances, we simulated the optical transmittance spectra and field profiles at ED and MD resonances.

Figure 16:
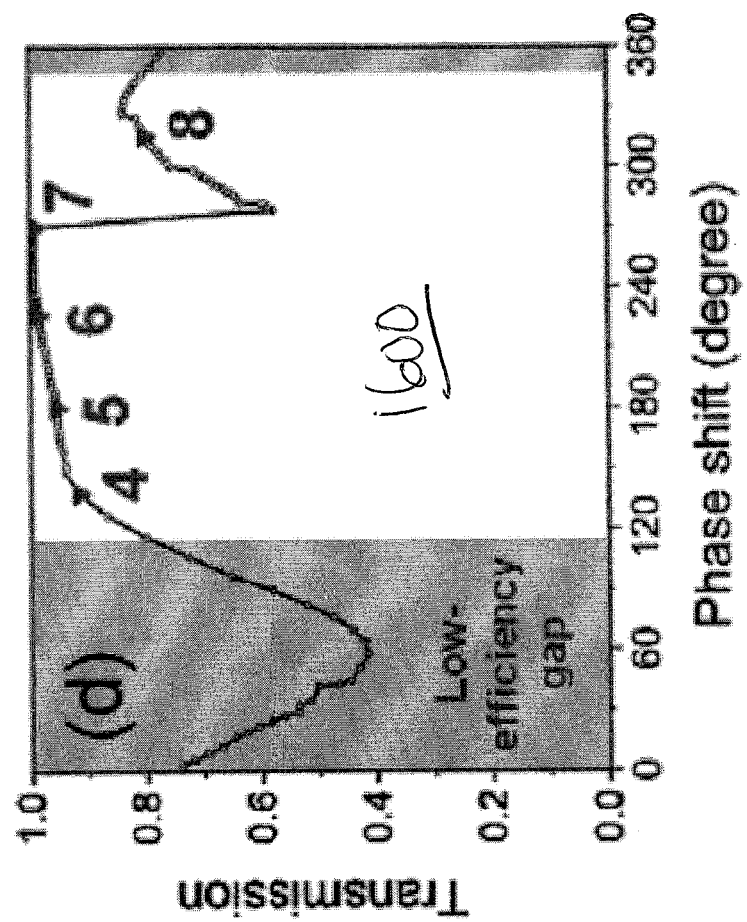
FIG. 16 is an example diagram illustrating an H-shaped elements according to embodiments herein.

According to the Kerker condition, spectrally overlapping ED and MD resonances allow a maximum of 360-degree phase shift with near-unity transmittance. To fulfill the condition, the ED and MD resonances of the rectangular meta-atom are independently tuned through adjusting the PbTe block dimensions such as Lx and Ly: the degrees of freedom enables full 360-degree phase coverage by detuning the ED and MD resonances slightly off the operation wavelength. Optimal rectangular meta-atom performance, derived from these figures by selecting Lx and Ly to yield the highest optical transmission at each phase shift value between 0 to 360 degree, is plotted in graph 1600 of FIG. 16. As shown, the use of rectangular meta-atoms offer 360-degree phase coverage, ~120° phase range (shaded area in graph 1600 of FIG. 16) of which such devices would have low optical transmission (<80%). This indicates that at least two unit cells will endure poor optical efficiency if eight discretized phases are adopted for the HMS. Similar low-efficiency gaps can also be observed in HMS designs relying on a single type of meta-atom geometry, be it circular, elliptical, or square.

Figure 17:
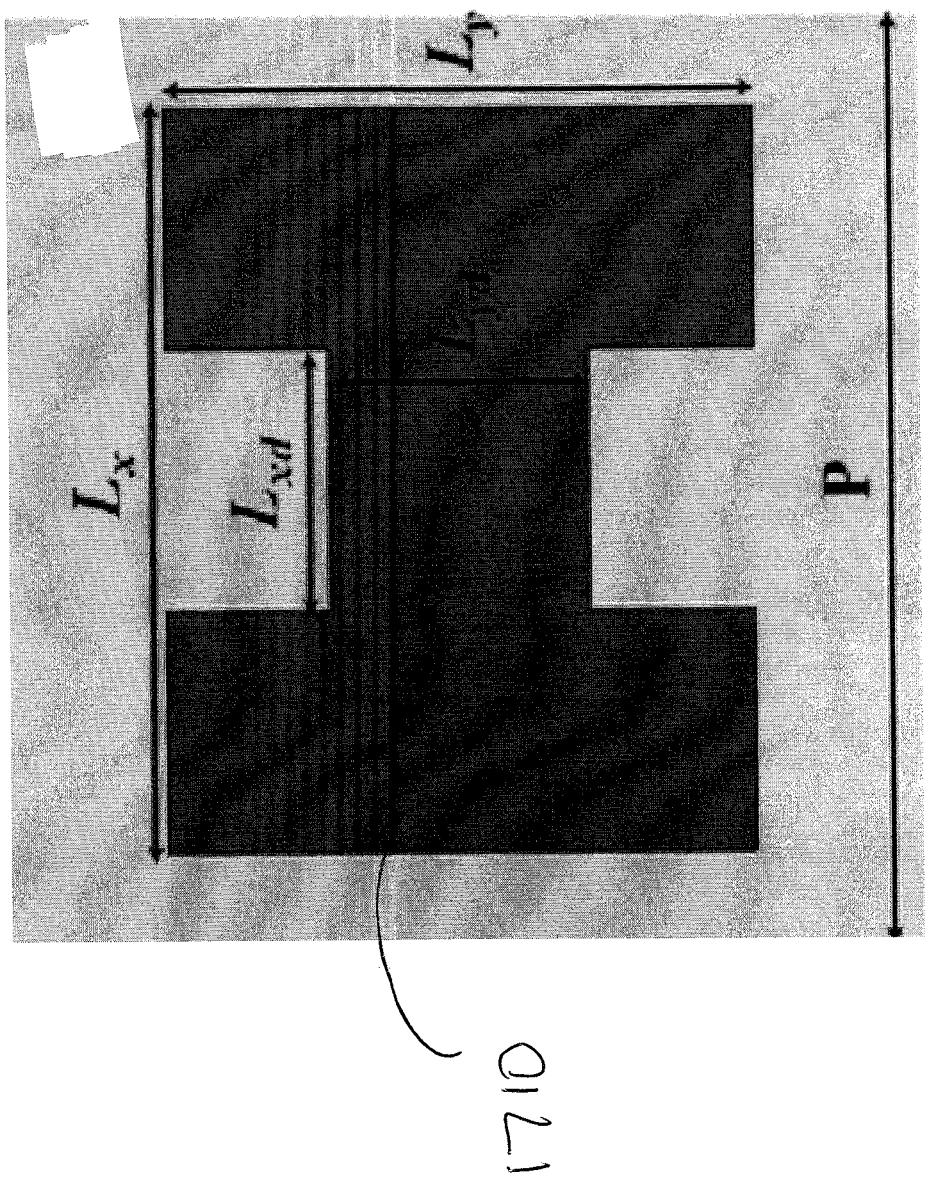
FIG. 17 is an example diagram illustrating transmission versus phase shift associated with rectangular-shaped elements according to embodiments element according to embodiments herein.

To circumvent this limitation, embodiments herein include a new class of meta-atoms (element 1710) with an H-shaped geometry as shown in FIG. 17. The H-shaped meta-atom structure 1710 (which is akin to elements 410-1, 410-2, 410-3) can be deemed as a pair of dielectric resonators separated by an air gap and connected by a dielectric bar. The H-shaped meta-atoms 1710 exhibit both ED and MD resonances, and their resonant behavior is readily tuned by varying the dielectric bar dimensions.

Figure 18:
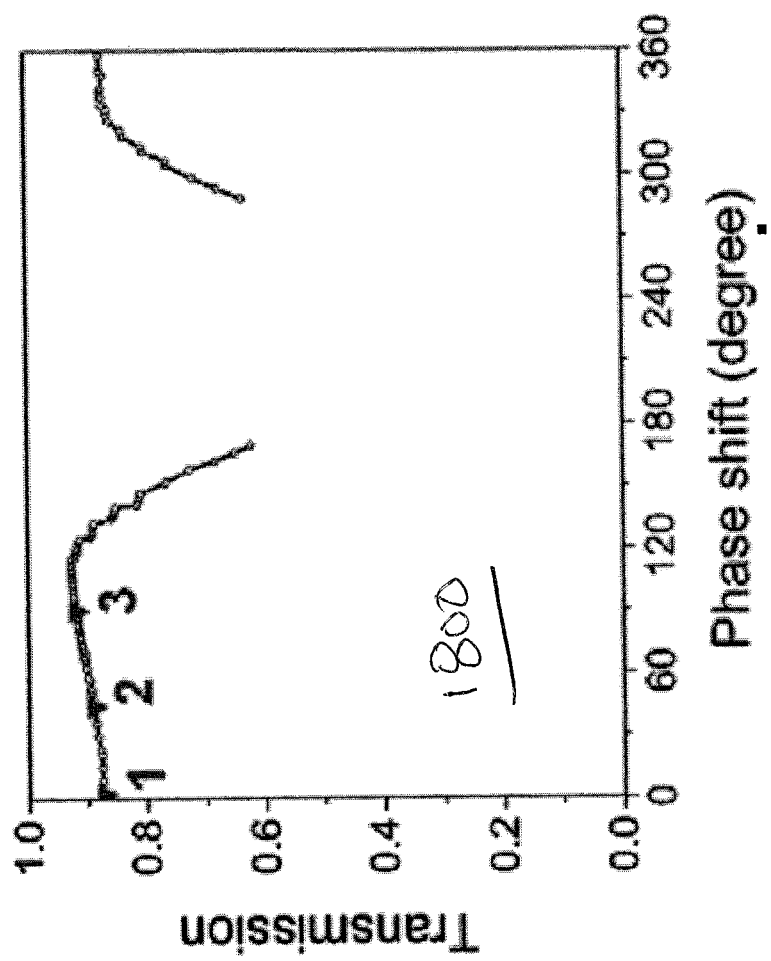
FIG. 18 is an example diagram illustrating transmission versus phase shift associated with H-shaped elements according to embodiments element according to embodiments herein.

FIG. 18 is a graph 1800 that plots the simulated transmission amplitude of the H-shaped meta-atoms as a function of the corresponding phase delay. Transmission exceeding 85% can be attained within the entire low-efficiency gap of the rectangular meta-atoms (such as also discussed above via elements 410-4, 410-5, 410-6, 410-7, 410-8).

Figure 19:
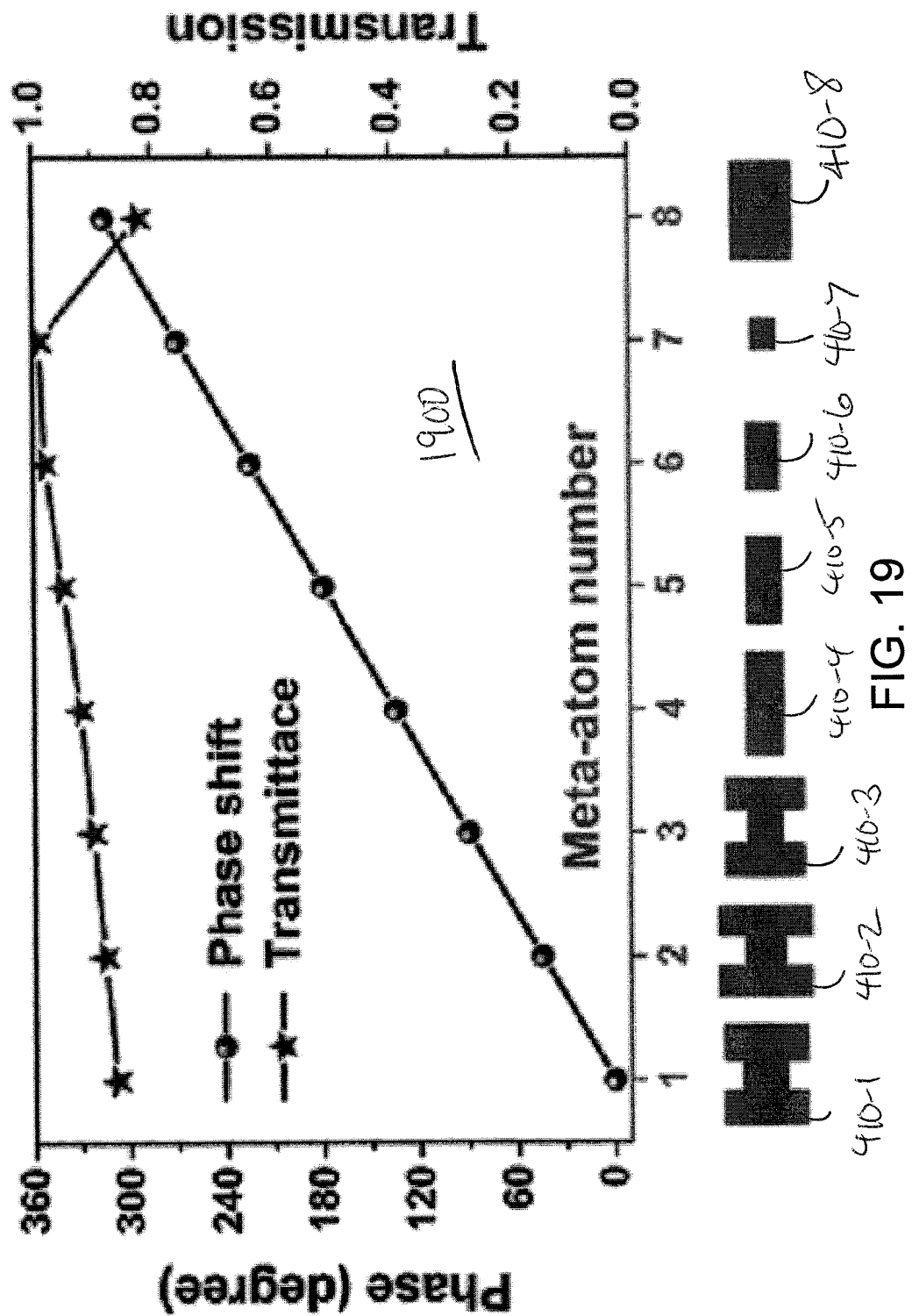
FIG. 19 is an example diagram illustrating phase and transmission capabilities associated with the different elements (as indicated by Meta Atom Number) according to embodiments herein.

HMS unit cells, as illustrated in graph 1900 of FIG. 19, combines the rectangular and H-shaped meta-atoms to achieve superior optical efficiency across the full 2 PI phase range. As previously discussed, further details of the structures 410 are discussed in FIG. 4.

Material Characterization and Optical Device Fabrication

Figure 20:
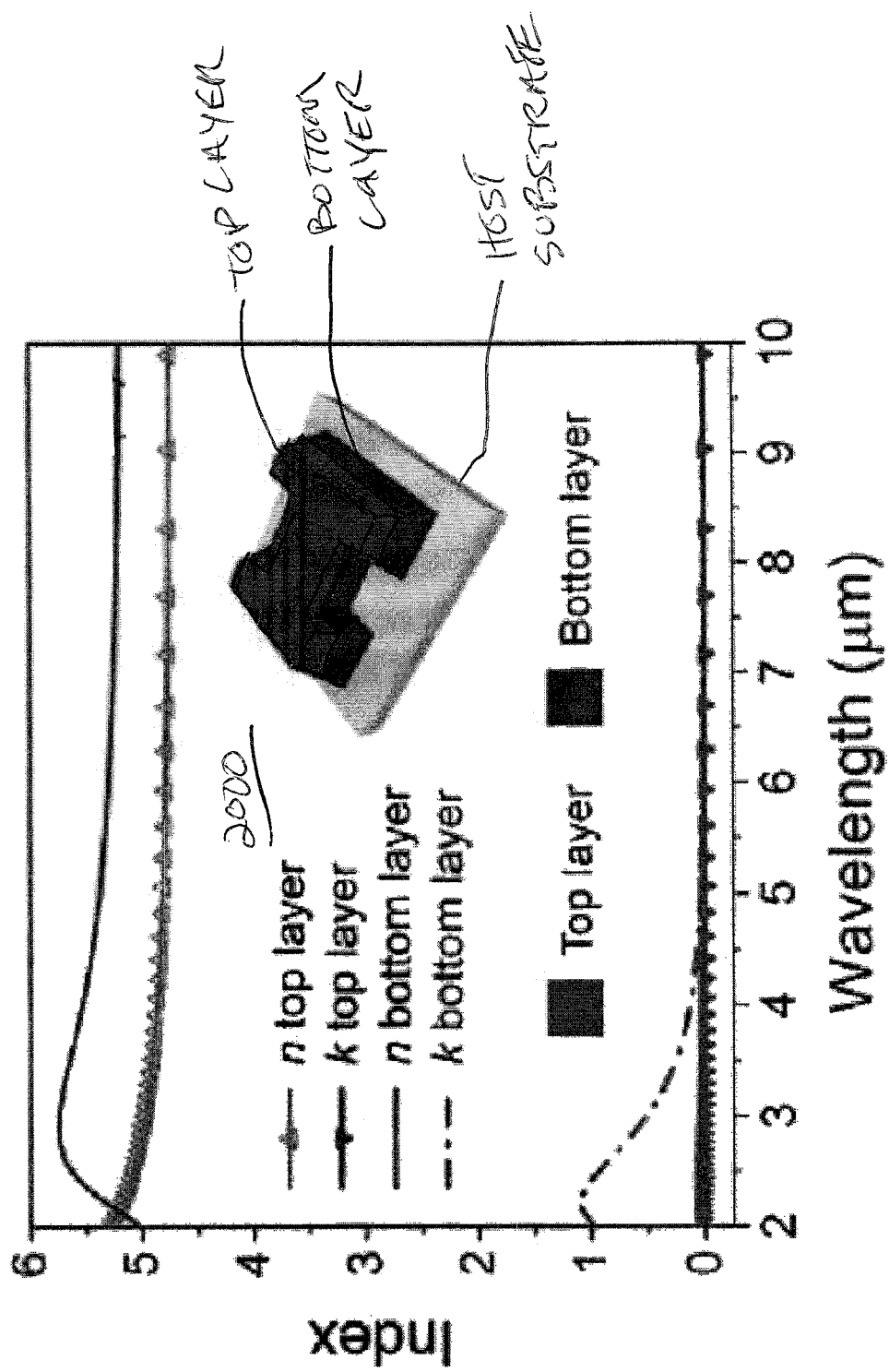
FIG. 20 is an example diagram illustrating different refractive indexes at different wavelengths for the material used to fabricate an optical device according to embodiments herein.

In one non-limiting example embodiment, to fabricate an optical device, PbTe films with a thickness of 650 nm (nanometers) are thermally evaporated onto double-side polished $CaF_2$ host substrates. FIG. 20 includes a graph 2000 plotting the refractive index n and extinction coefficient k of the PbTe material such as measured using variable angle spectroscopic ellipsometry (J. A. Woollam Co.). In certain embodiments, a phenomenological two-layer model of the H-shaped or rectangular shaped structure best describes the optical properties of the film, which properly accounts for the slight composition variation throughout the film thickness sue to noncongruent vaporization. The model also yields excellent agreement between our design and experimental measurements on the meta-optical devices.

In one embodiment, a cross-sectional SEM micrograph of the PbTe film, would reveal a dense, columnar nanocrystalline microstructure free of voids. The film's fine grain structure produces a smooth surface finish with a root-mean-square (RMS) surface roughness of 6 nm. A low surface roughness contributes to minimizing optical scattering loss despite the high index contrast.

Figure 21:
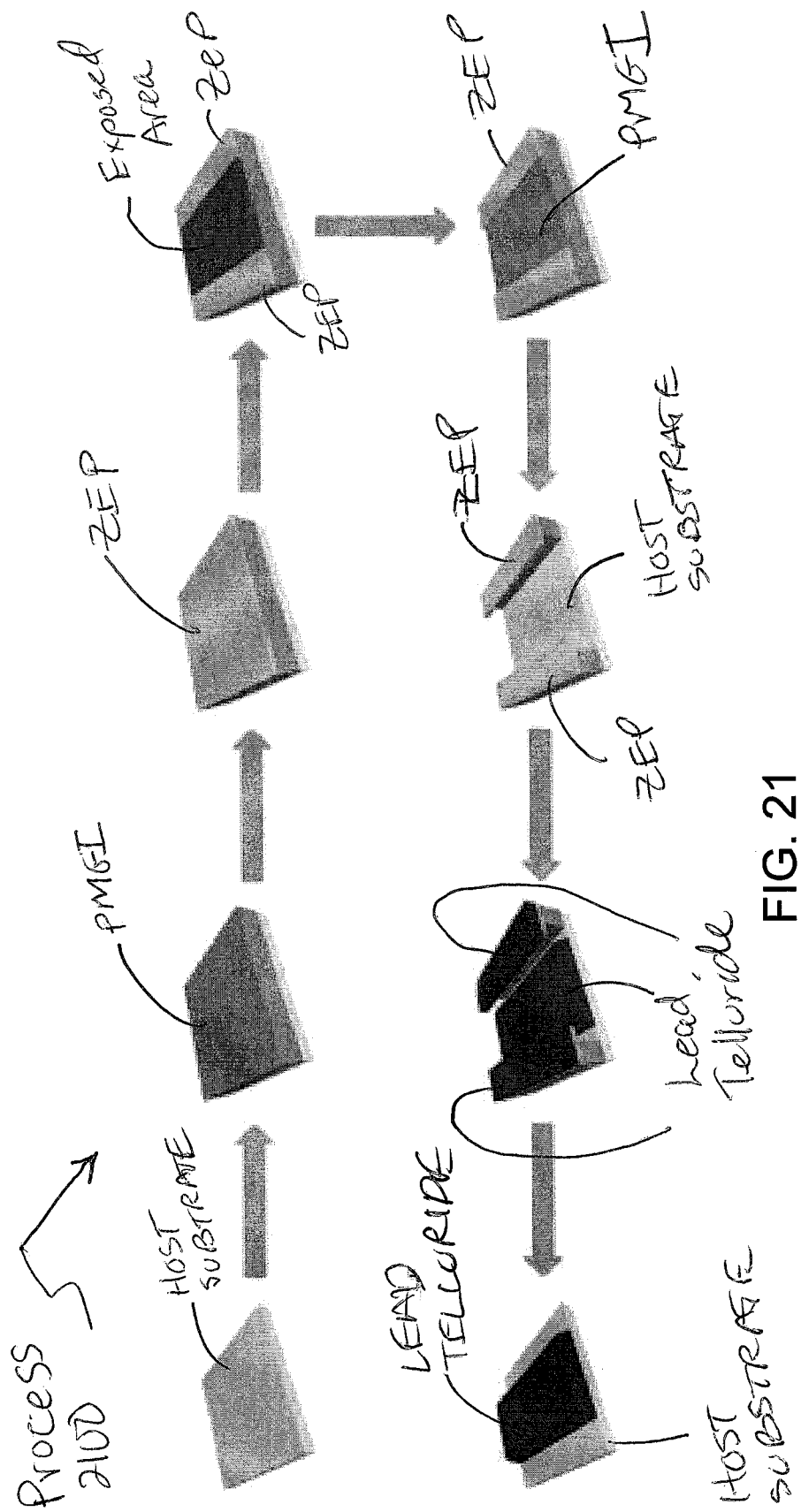
FIG. 21 is an example diagram illustrating a process of creating an optical device according to embodiments herein.

FIG. 21 is an example diagram illustrating fabrication flow of the meta-optical devices according to embodiments herein.

Figure 22:
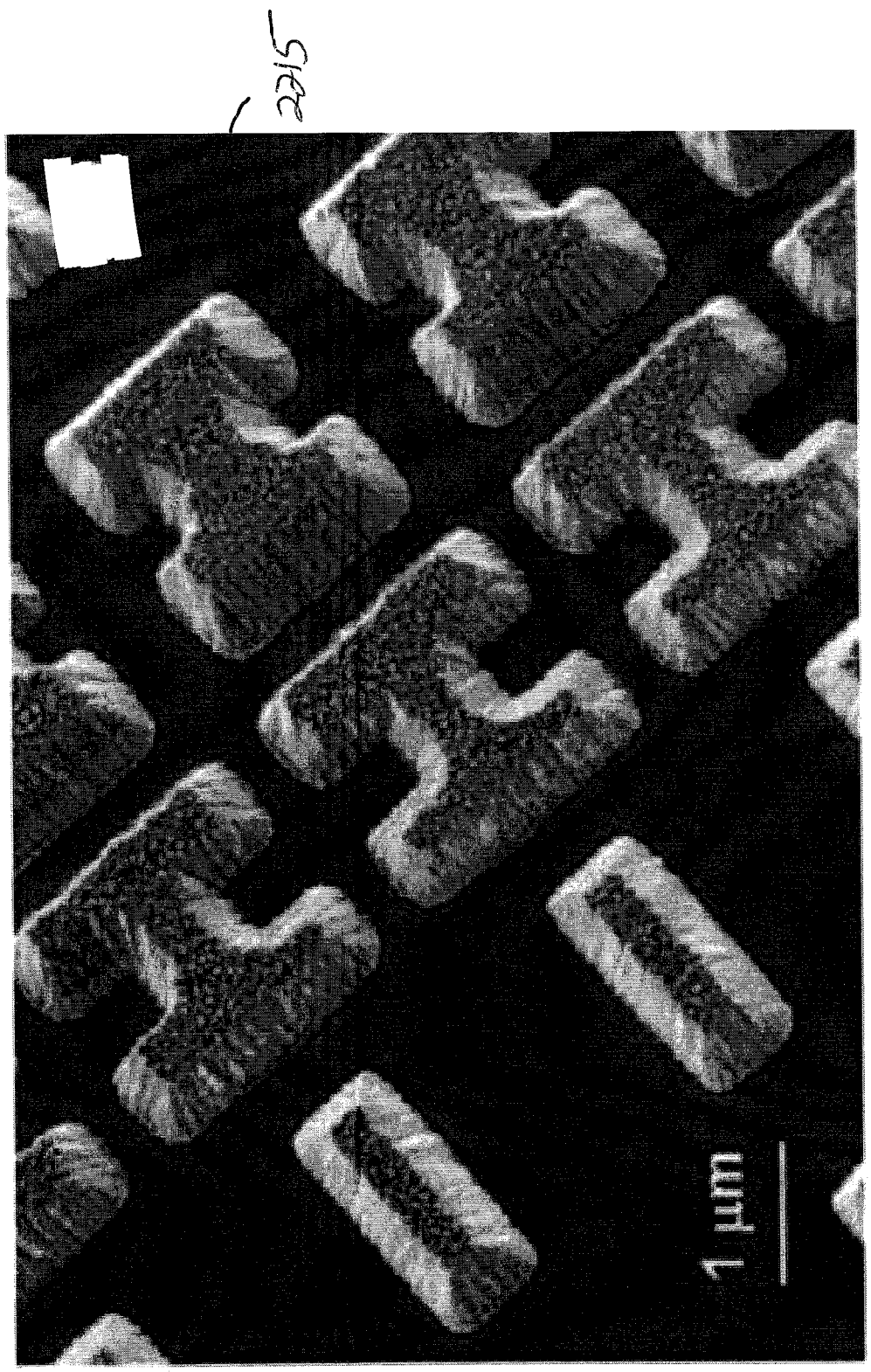
FIG. 22 is an example diagram illustrating multiple elements disposed on a respective substrate of an optical device according to embodiments herein.

Details of the fabrication process 2100 are furnished in methods as further described herein. In contrast to conventional metasurfaces relying on waveguiding effects which entails meta-atoms with a large aspect ratio and specialized fabrication protocols, embodiments herein include a low-profile (with a maximum aspect ratio of merely 1.25) HMS structures that are readily fabricated using a simple double-layer electron beam resist lift-off process. In one embodiment, the liftoff process results in PbTe structures with a sidewall angle of 68°, and this non-vertical sidewall profile was taken into consideration in our meta-atom design. In one embodiment, we measured RMS sidewall roughness of 12 nm and a small roughness correlation length of 11 nm on the fabricated metaatoms, which is primarily attributed to the nano-scale columnar grain structure as shown in FIG. 22.

Such roughness of the elements diposed on host substrate 2215 incur negligible scattering loss in the mid-IR meta-optical devices.

Diffractive Beam Deflector

FIG. 23 is an example diagram illustrating a top-view SEM image of the fabricated meta-optical beam deflector (optical device) according to embodiments herein. A supercell 2320 of the optical device 2310 includes eight meta-atoms based on the two-component design illustrated in FIG. 19. In this non-limiting example embodiment, the supercell 2320 is tiled along both x and y directions with periods of Gx=20 um and Gy=2.5 um, respectively. Along the x-axis, the structure acts as a diffractive grating, and the meta-atoms generate a step-wise phase profile resembling that of a traditional blazed grating to selectively enhance optical scattering into the first diffraction order while suppressing all others.

Along the y-direction, the period is smaller than the free-space wavelength and hence no diffraction (other than the zeroth order specular transmission) takes place. According to a theoretical model, most optical power (66%) is concentrated into the first transmissive diffraction order at a Bragg deflection angle of 15.1°.

Figure 24:
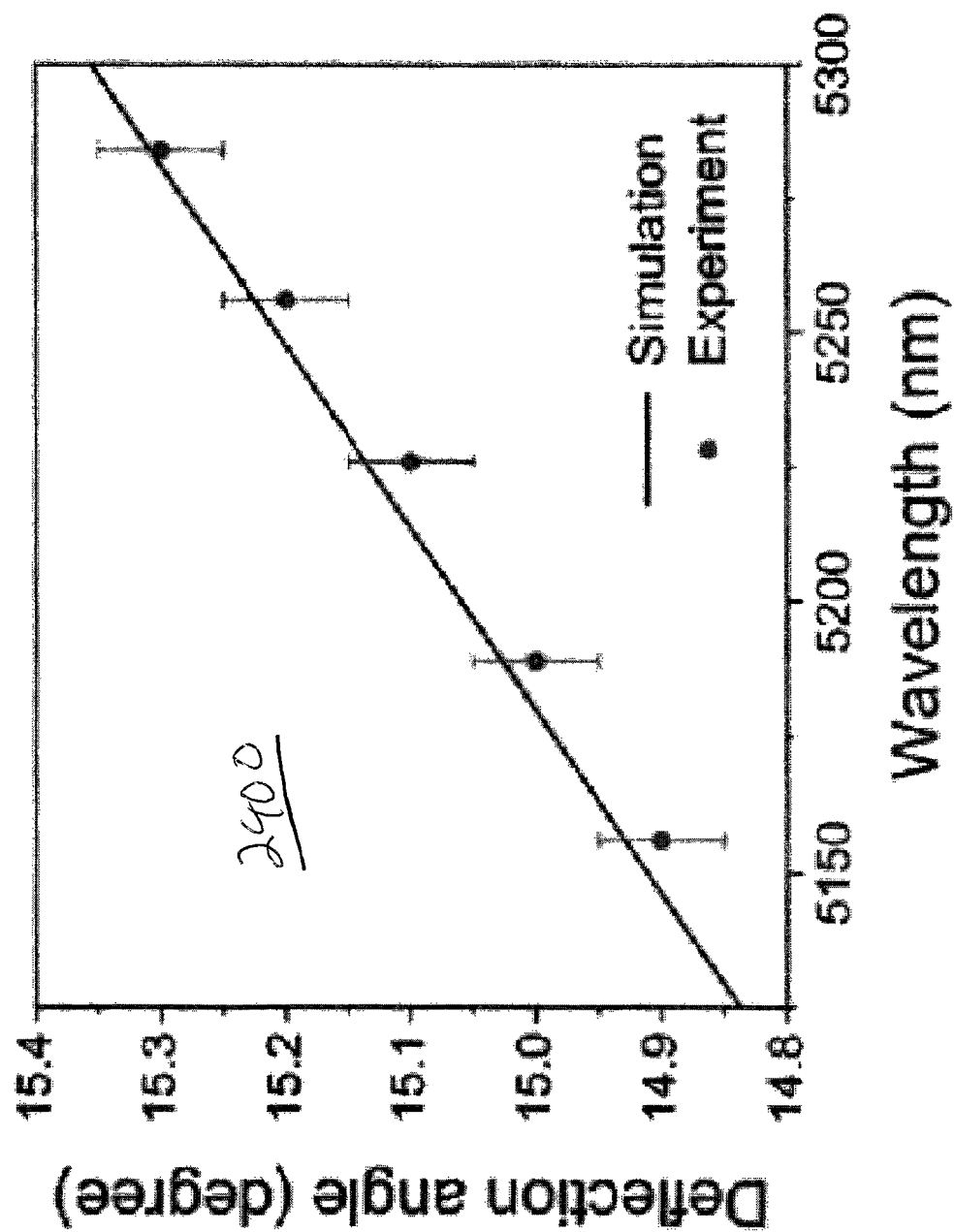
FIG. 24 is an example diagram illustrating deflection angle versus wavelength associated with an optical device according to embodiments herein.
Figure 25:
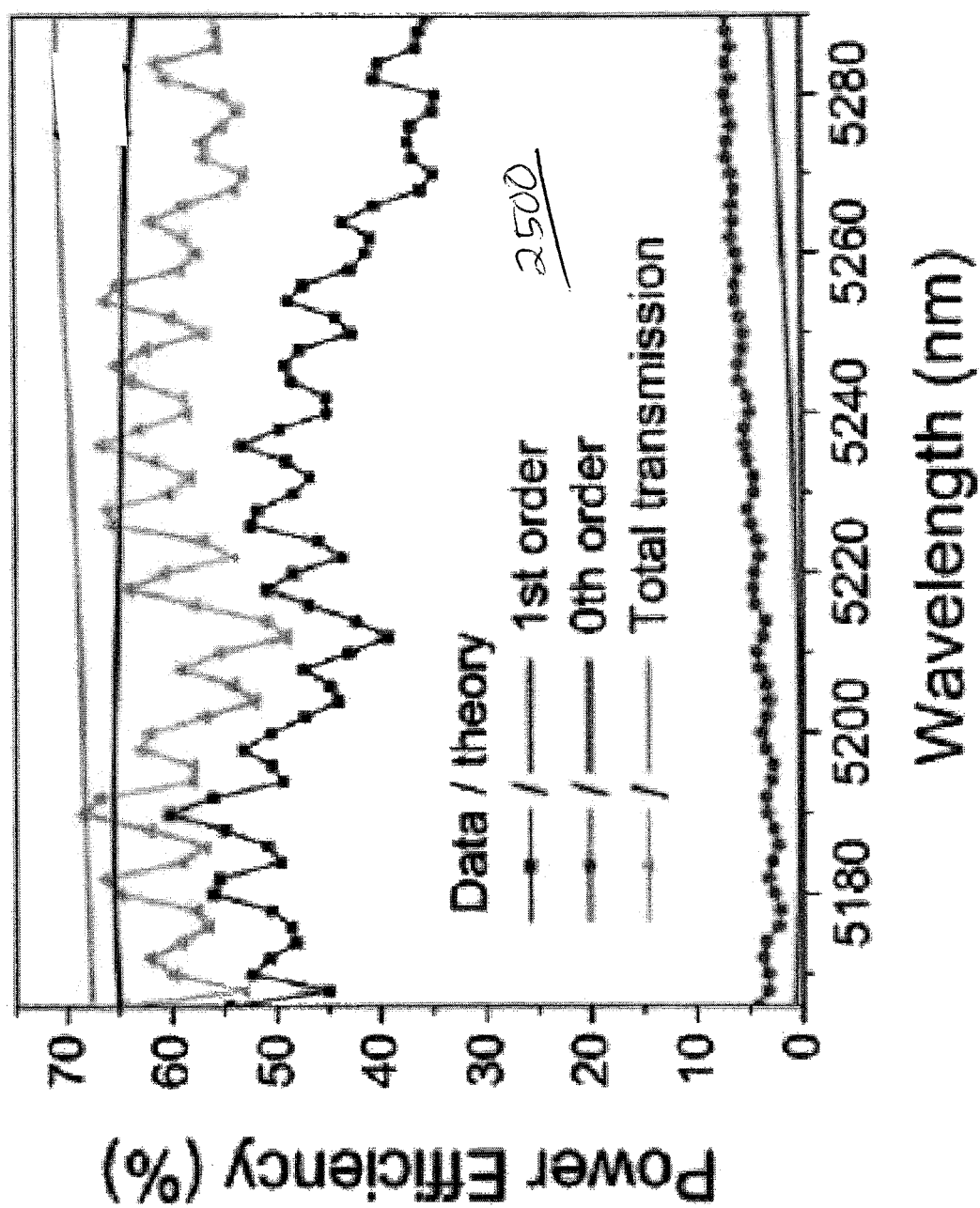
FIG. 25 is an example diagram illustrating power efficiency versus wavelength according to embodiments herein.

FIGS. 24 and 25 include respective graphs 2400 and 2500 comparing the simulated and measured deflection angle and diffraction efficiency of the deflector over the spectral band of 5.16-5.29 um. While the measured diffractive power is slightly lower than the simulated value, the overall trend closely follows the theoretical predictions. The Fabry-Perot fringes on the measured spectra, which exhibit a free spectral range (FSR) of 9.3 nm, result from reflections at the 1-mm-thick $CaF_2$ substrate surfaces.

Figure 26:
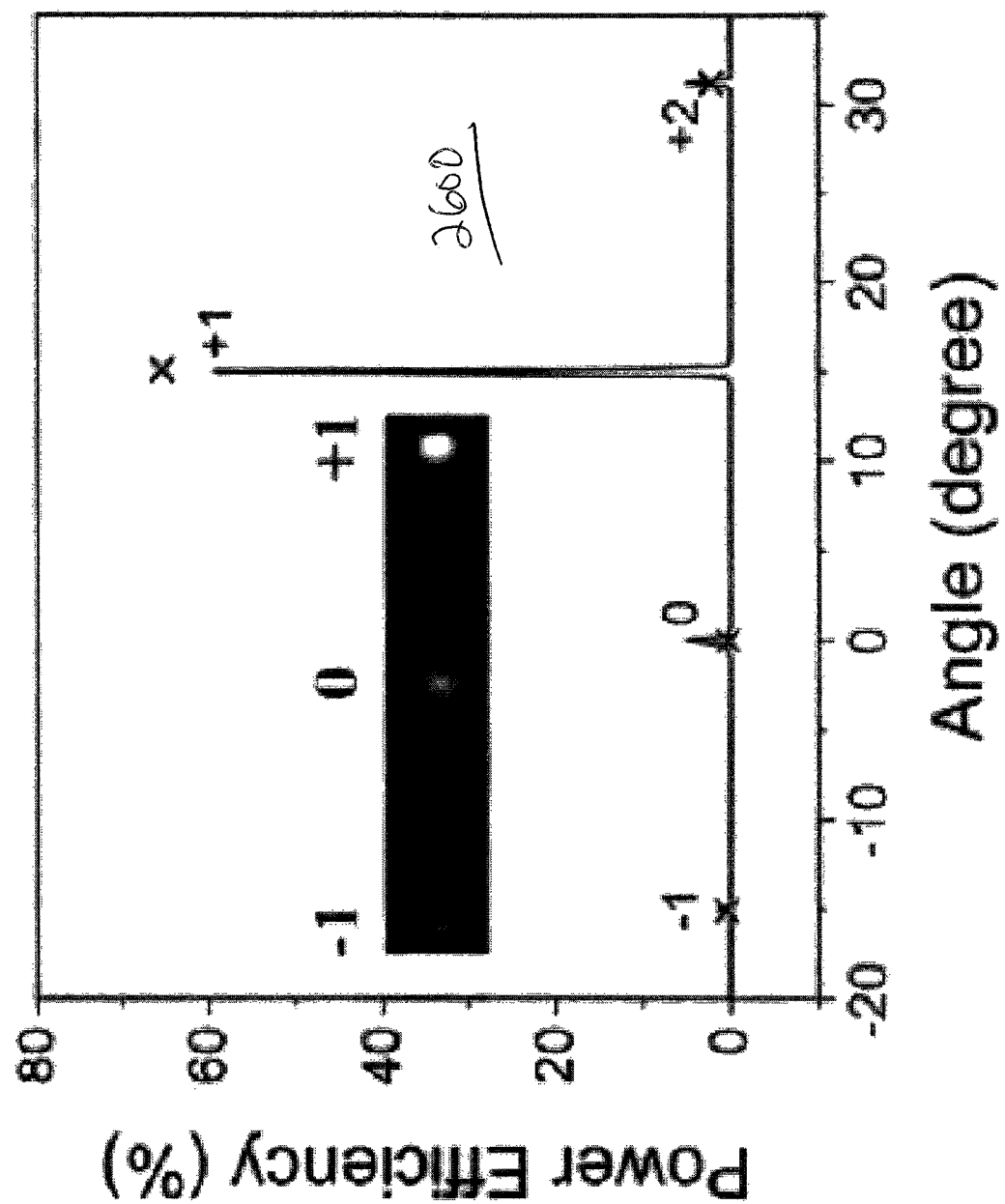
FIG. 26 is an example diagram illustrating power efficiency versus angle according to embodiments herein.

The two performance metrics of a beam defector are absolute diffraction efficiency, which is defined as power of the deflected beam in the target (blazed) diffraction order normalized to total incident power (not corrected for Fresnel reflection losses from the substrate surfaces), and extinction ratio (ER), the optical power ratio between the first diffraction order and specular transmission (the zeroth order). One embodiment herein includes a peak absolute diffraction efficiency of 60% and an ER of 12 dB at 5.19 um wavelength as shown in graph 2600 of FIG. 26. Notably, the novel optical device as discussed herein provides significant performance enhancement over previously conventional HMS beam deflectors at optical frequencies (diffraction efficiency 20%, ER 3 dB35 and diffraction efficiency 36%, ER not reported33) and is on par with the best mid-IR transmissive gratings demonstrated to date (diffraction efficiency 63%, ER 11 dB). Fresnel reflection from the HMS constitutes the primary source of optical loss in the present device, which can further be mitigated with improved meta-atoms designs and anti-reflection coated substrates.

Cylindrical Lens

In the HMS cylindrical lens, the meta-atoms are arranged such that a parabolic phase profile is introduced along the x-axis whereas the structure is tiled along the y-direction with a subwavelength period to suppress non-specular diffraction orders. In one example embodiment, the lens is designed with a focal length of 0.5 mm and a numerical aperture (NA) of 0.71.

Aspheric Lens

Aspheric lenses are essential elements for aberration-free imaging systems. Metasurfaces, with their facile ability to generate almost arbitrary optical phase profiles, provides a versatile alternative to conventional geometric shaping in aspheric lens design. Metasurface-based aspheric lenses with focusing performances at the diffraction limit have been demonstrated in the telecom band and in the mid-IR with a reflectarray configuration. The optical device 2710 (and magnified portion 2710-1 of the optical device 2710) as in FIG. 27 according to embodiments herein provides diffraction-limited focusing and imaging capabilities in a mid-IR transmissive metasurface lens.

Device Fabrication

In one embodiment, the starting substrates for the meta-optical devices are double-side polished calcium fluoride ($CaF_2$) from MTI Corporation. Prior to lithographic patterning, the host substrates are treated with oxygen plasma to improve adhesion with resist layers and respective PbTe thin films to fabricate multiple elements 120.

In one non-limiting example embodiment, a polymethyl-glutarimide (PMGI-SF9, MicroChem Corp.) resist layer with a thickness of 800 nm is first spin coated on the host substrate, followed by coating of a ZEP-520A electron beam resist film (Zeon Chemicals L.P.) with a thickness of 400 nm. A water-soluble conductive polymer layer (ESpacer 300Z, Showa Denko America, Inc.) is subsequently coated on the resist film to prevent charging during electron beam writing, and the polymer layer was removed after lithography by rinsing in deionized water.

The ZEP resist can be exposed on an Elionix ELS-F125 electron beam lithography system. The double-layer resist, ZEP and PMGI, is then sequentially developed by immersion in ZED-N50 (Zeon Chemicals L.P.) and RD6 (Futurrex Inc.) solutions. Development time in the RD6 solution was timed to precisely control undercut of the PMGI layer and facilitate lift-off patterning. A PbTe film is deposited via thermal evaporation using a custom-designed system (PVD Products, Inc.) Small chunks of PbTe with a purity of 99.999% (Fisher Scientific) can be used as the evaporation source material. The deposition rate can be monitored in real time using a quartz crystal microbalance and was stabilized at 17 Å/s. The substrate is not actively cooled although the substrate temperature can be maintained below 40° C. throughout the deposition as measured by a thermocouple. After deposition, the devices are soaked in an n-methyl-2-pyrrolidone (NMP) solution heated to 70° C. to lift-off the resist masked portion and complete the device fabrication.

Note again that techniques as discussed herein are well suited for use in different types of optical devices tuned for any of multiple different optical applications. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this disclosure has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An optical device comprising:
   a host substrate fabricated from a first material, the first material being a dielectric material transparent in the Infrared range;
   multiple elements disposed directly on a first surface of the host substrate, the multiple elements spaced apart from each other on the first surface of the host substrate, each of the multiple elements fabricated from a second material having a refractive index greater than 4.5; and
   wherein the multiple elements include a first element and a second element, the first element affixed to a first region of the first surface, the second element affixed to a second region of the first surface, the second region disposed adjacent to the first region, the first element being H-shaped.

2. The optical device as in claim 1, wherein the second material is a chalcogenide-based material.

3. The optical device as in claim 2, wherein the first material is a Flouride-based material.

4. The optical device as in claim 1, wherein the second material includes Lead Telluride (PbTe).

5. The optical device as in claim 4, wherein the first material includes Calcium Flouride (CaF$_2$).

6. The optical device as in claim 1, wherein the multiple elements fabricated from the second material include multiple different shaped elements disposed on the first surface of the host substrate in accordance with a predefined pattern.

7. The optical device as in claim 6, wherein a first type of structure of the multiple different shaped elements is a rectangular-shaped structure.

8. The optical device as in claim 6, wherein a first type of structure of the multiple different shaped elements is a structure including a combination of rectangular shaped structures.

9. The optical device as in claim 1, wherein the multiple elements include a cross-shaped structure.

10. The optical device as in claim 1, wherein a difference between the refractive index of the second material and a refractive index of the first material is greater than 3.1.

11. The optical device as in claim 1, wherein a thickness of the multiple elements disposed on the first surface is less than 1000 nanometers.

12. The optical device as in claim 1, wherein a thickness of the multiple elements is less than a free space wavelength to which the optical device is tuned to redirect inputted optical signals.

13. The optical device as in claim 1, wherein a thickness of the multiple elements disposed on the first surface is less than one eighth of the free space wavelength to which the optical device is tuned to redirect inputted optical signals.

14. The optical device as in claim 1, wherein a combination of the host substrate and the multiple elements is operative to modulate a phase of incident light to produce an output optical signal.

15. The optical device as in claim 1, wherein a combination of the host substrate and the multiple elements is operative to modulate an amplitude of incident light received by the optical device to produce an output optical signal.

16. The optical device as in claim 1, wherein a combination of the host substrate and the multiple elements is operative to modulate a polarization of incident light received by the optical device to produce an output optical signal.

17. The optical device as in claim 1, wherein a combination of the host substrate and the multiple elements are operable to redirect an incident optical signal received by the optical device in at least one different direction with respect to a direction of the received incident optical signal.

18. The optical device as in claim 1, wherein the first material has a refractive index of less than 1.5.

19. The optical device as in claim 1, wherein the first material is a semiconductor material.

20. The optical device as in claim 1, wherein the multiple elements are patterned as a two-dimensional array on the first surface of the host substrate.

21. The optical device as in claim 20, wherein a first array of the two-dimensional array of the multiple elements on the first surface of the host substrate includes a first sequence of a first type of elements spaced apart from each other; and
wherein a second array of the two-dimensional array of the multiple elements on the first surface of the host substrate includes a second sequence of second elements including multiple elements of the first type and multiple elements of a second type spaced apart from each other.

22. The optical device as in claim 1, wherein the multiple elements on the first surface of the host substrate includes a combination of different sized H-shaped elements and rectangular-shaped elements.

23. The optical device as in claim 1, wherein a spacing between a set of adjacent elements disposed on the first surface of the host substrate is less than a half-wavelength to which the optical device is tuned.

24. The optical device as in claim 1, wherein a pattern of the multiple elements disposed on the first surface of the host substrate is operative to support a desired optical resonance of an optical signal incident to the optical device.

25. The optical device as in claim 1, wherein dimensions of the multiple elements are selected to tune an optical resonance associated with the multiple elements.

26. The optical device as in claim 1, wherein the multiple elements disposed on the first surface of the host substrate include a repeating pattern of different types of optical elements.

27. The optical device as in claim 1, wherein the multiple elements disposed on the first surface of the host substrate are operative to phase shift a received optical signal to produce an output optical signal from the optical device.

28. The optical device as in claim 1, wherein the multiple elements disposed on the first surface of the host substrate are meta-atom structures supporting both electric dipole (ED) and magnetic dipole (MD) resonances.

29. The optical device as in claim 28, wherein the electric dipole (ED) and magnetic dipole (MD) resonances are independently tuned based on dimensions of the meta-atom structures.

30. The optical device as in claim 1, wherein the first surface of the host substrate is a curved surface.

31. The optical device as in claim 1, wherein the second material is absent in a spacing between the first element and the second element.

32. An optical device comprising:
a host substrate fabricated from a first material, the first material being a dielectric material transparent in the Infrared range;
multiple elements disposed on a first surface of the host substrate, the multiple elements spaced apart from each other on the first surface of the host substrate, each of the multiple elements fabricated from a second material having a refractive index greater than 4.5; and
wherein a combination of the host substrate and the multiple elements provides an optical efficiency of greater than 75% through the optical device for wavelengths in the mid infrared wavelength range.

33. A method comprising:
receiving a host substrate fabricated from a first material, the first material being a dielectric material optically transparent in the Infrared range;
disposing multiple elements on a first surface of the host substrate, the multiple elements spaced apart from each other on the first surface of the host substrate, each of the multiple elements fabricated from a second material having a refractive index greater than 4.5; and wherein a combination of the host substrate and the multiple elements provide an optical efficiency of greater than 75% through the optical device for wavelengths in the mid infrared wavelength range.

34. The method as in claim 33 further comprising:
producing the host substrate using a Flouride-based material; and
producing the multiple elements to include a chalcogenide-based material.

35. The method as in claim 33, wherein disposing the multiple elements on the host substrate includes:
producing the multiple elements to include a first set of elements of a first type structure and a second set of elements of a second type structure, the first set of elements and the second set of elements disposed on the host substrate in accordance with a predefined pattern.

36. The method as in claim 35 further comprising:
fabricating the first type of structure to be a rectangular-shaped structure and the second type structure to be an H-shaped structure.

37. The method as in claim 33, wherein a difference between the refractive index of the second material and a refractive index of the first material is greater than 3.1.

38. The method as in claim 33 further comprising:
limiting a thickness of the multiple elements to be less than 1000 nanometers.

39. The method as in claim 33 further comprising:
producing the thickness of the multiple elements to be less than a portion of a free space wavelength to which the combination of the host material and the multiple elements is tuned to redirect inputted optical signals.

40. Computer-readable storage hardware having instructions stored thereon, the instructions, when carried out by computer processor hardware, cause the computer processor hardware to:
fabricate a host substrate from a first material, the first material being a dielectric material;
disposing multiple elements on a first surface of the host substrate, the multiple elements spaced apart from each other on the first surface of the host substrate, each of the multiple elements fabricated from a second material having a refractive index greater than 4.5; and
wherein the multiple elements include multiple instances of a first structure fabricated from the second material, each instance of the first structure including a pair of dielectric resonators separated by an air gap and connected by a dielectric bar.

41. The optical device as in claim 1, wherein the multiple elements include a first set of elements disposed in a first element array and a second set of elements disposed in a second element array.

42. The optical device as in claim 41, wherein the first set of elements in the first element array vary in shape; and
wherein the second set of elements disposed in the second element array are of a same shape.

43. An optical device comprising:
a host substrate fabricated from a first material, the first material being a dielectric material transparent in the Infrared range;
multiple elements disposed directly on a first surface of the host substrate, the multiple elements spaced apart from each other on the first surface of the host substrate, each of the multiple elements fabricated from a second material having a refractive index greater than 4.5; and
wherein the multiple elements include multiple instances of a first structure fabricated from the second material, each instance of the first structure including a pair of dielectric resonators separated by an air gap and connected by a dielectric bar.

* * * * *